United States Patent
Zong

(10) Patent No.: US 11,313,039 B2
(45) Date of Patent: Apr. 26, 2022

(54) NANO-COATING PROTECTION METHOD FOR ELECTRICAL DEVICES

(71) Applicant: Jiangsu Favored Nanotechnology Co., LTD, Wuxi (CN)

(72) Inventor: Jian Zong, Irvine, CA (US)

(73) Assignee: Jiangsu Favored Nanotechnology Co., LTD, Wuxi (CN)

( * ) Notice: Subject to any disclaimer, the term of this patent is extended or adjusted under 35 U.S.C. 154(b) by 226 days.

(21) Appl. No.: 16/404,588

(22) Filed: May 6, 2019

(65) Prior Publication Data

US 2019/0338421 A1 Nov. 7, 2019

Related U.S. Application Data

(60) Provisional application No. 62/667,413, filed on May 4, 2018, provisional application No. 62/667,408, filed on May 4, 2018.

(51) Int. Cl.
*C23C 16/50* (2006.01)
*C23C 16/52* (2006.01)
(Continued)

(52) U.S. Cl.
CPC .............. *C23C 16/50* (2013.01); *B05D 1/60* (2013.01); *B05D 1/62* (2013.01); *B05D 3/147* (2013.01);
(Continued)

(58) Field of Classification Search
CPC .......... B05D 1/60; B05D 3/049; B05D 3/147; B05D 1/62; C23C 16/515; C23C 16/4584;
(Continued)

(56) References Cited

U.S. PATENT DOCUMENTS 4,921,723 A 5/1990 Nichols et al.
4,926,793 A 5/1990 Arima et al.
(Continued)

FOREIGN PATENT DOCUMENTS

CN 107142465 A 9/2017
CN 107201511 A 9/2017
(Continued)

OTHER PUBLICATIONS

CN 107201511 Zong (2017) English Machine Translation retrieved from ESPACENET Jan. 4, 2022.
(Continued)

*Primary Examiner* — Yuechuan Yu
(74) *Attorney, Agent, or Firm* — Perkins Coie LLP

(57) ABSTRACT

Introduced here is a plasma polymerization apparatus and process. Example embodiments include a vacuum chamber in a substantially symmetrical shape to a central axis. A rotation rack may be operable to rotate about the central axis of the vacuum chamber. Additionally, reactive species discharge mechanisms positioned around a perimeter of the vacuum chamber in a substantially symmetrical manner from the outer perimeter of the vacuum chamber may be configured to disperse reactive species into the vacuum chamber. The reactive species may form a polymeric multi-layer coating on surfaces of the one or more devices. Each layer may have a different composition of atoms to enhance the water resistance, corrosion resistance, and fiction resistance of the polymeric multi-layer coating.

8 Claims, 7 Drawing Sheets

(51) Int. Cl.
    *B05D 1/00*            (2006.01)
    *C23C 16/458*        (2006.01)
    *B05D 3/14*            (2006.01)
    *H01J 37/32*          (2006.01)
    *H01B 7/28*            (2006.01)
    *H01R 13/03*          (2006.01)
    *H01R 43/00*          (2006.01)

(52) U.S. Cl.
    CPC .......... *C23C 16/4584* (2013.01); *C23C 16/52* (2013.01); *H01J 37/32082* (2013.01); *H01J 37/32715* (2013.01); *C23C 16/458* (2013.01); *H01B 7/2806* (2013.01); *H01J 37/32541* (2013.01); *H01J 2237/20214* (2013.01); *H01J 2237/20221* (2013.01); *H01J 2237/20278* (2013.01); *H01J 2237/332* (2013.01); *H01R 13/03* (2013.01); *H01R 43/005* (2013.01)

(58) Field of Classification Search
    CPC ....... C23C 16/52; C23C 16/50; C23C 16/458; H01J 37/3271; H01J 37/32082; H01J 2237/20214; H01J 37/32541; H01J 2237/20221; H01J 2237/332; H01J 2237/20278; H01B 7/2806; H01R 43/005; H01R 13/03
See application file for complete search history.

(56) References Cited

U.S. PATENT DOCUMENTS

| | | |
|---|---|---|
| 5,795,448 A | 8/1998 | Hurwitt et al. |
| 5,840,427 A | 11/1998 | Babu et al. |
| 6,471,837 B1 | 10/2002 | Hans et al. |
| 2003/0116089 A1* | 6/2003 | Walther ............ H01J 37/32752 118/723 E |
| 2004/0101636 A1 | 5/2004 | Kuhr et al. |
| 2005/0211171 A1* | 9/2005 | Hanawa ................ C23C 16/045 118/723 R |
| 2006/0257950 A1 | 11/2006 | Pestlin et al. |
| 2008/0102206 A1 | 5/2008 | Wagner |
| 2010/0219160 A1 | 9/2010 | Schmidt et al. |
| 2013/0033825 A1 | 2/2013 | Brooks et al. |
| 2014/0141221 A1 | 5/2014 | Storey et al. |
| 2014/0318454 A1* | 10/2014 | Tamagaki ......... H01J 37/32779 118/723 R |
| 2015/0210651 A1 | 7/2015 | Kuhlmann et al. |
| 2015/0232688 A1 | 8/2015 | Legein et al. |
| 2017/0257950 A1 | 9/2017 | Brotzman et al. |

FOREIGN PATENT DOCUMENTS

| | | |
|---|---|---|
| DE | 102009046947 A1 | 5/2011 |
| EP | 0533606 A1 | 11/1992 |
| GB | 2500138 A | 9/2013 |
| WO | 2006063388 A1 | 6/2006 |
| WO | 2014127304 A1 | 8/2014 |
| WO | 2017193561 A1 | 11/2017 |

OTHER PUBLICATIONS

CN 107142465 Zong (2017) English Machine Translation retrieved from ESPACENET Jan. 4, 2022.
EP 0533606 Frederic (1992) English Machine Translation retrieved from ESPACENEI Jan. 4, 2022.
DE 102009046947 Klaus-Dieter (2011) English Machine Translation retrieved from ESPACENET Jan. 4, 2022.

\* cited by examiner

NANO-COATING PROTECTION METHOD FOR ELECTRICAL DEVICES

CROSS-REFERENCE TO RELATED APPLICATIONS

This application claims priority to U.S. Provisional Patent Application Ser. No. 62/667,408 filed on May 4, 2018 and U.S. Provisional Patent Application Ser. No. 62/667,413 filed on May 4, 2018. The content of the above-identified applications are incorporated herein by reference in its entirety.

TECHNICAL FIELD

The present disclosure relates to plasma polymerization technologies and, more specifically, to a plasma polymerization coating apparatus and process.

TECHNICAL BACKGROUND

The plasma polymerization coating treatment is an important surface treatment technique because of its advantages over other conventional techniques. For example, in plasma polymerization coating, polymers can be directly attached to a desired surface where molecular chains grow. This reduces the overall number of steps necessary for coating the surface to be treated. Other advantages include the availability of a wider selection of monomers, as compared to conventional chemical polymerization techniques.

However, due to various shortcomings in existing designs of conventional plasma coating equipment, conventional plasma polymerization treatment often suffers from production limitations, resulting in small batch size, low efficiency, high cost, and poor batch uniformity.

BRIEF DESCRIPTION OF DRAWINGS

One or more embodiments of the present disclosure are illustrated by way of example and not limitation in the figures of the accompanying drawings, in which like references indicate similar elements. These drawings are not necessarily drawn to scale.

DETAILED DESCRIPTION

Figure 1:
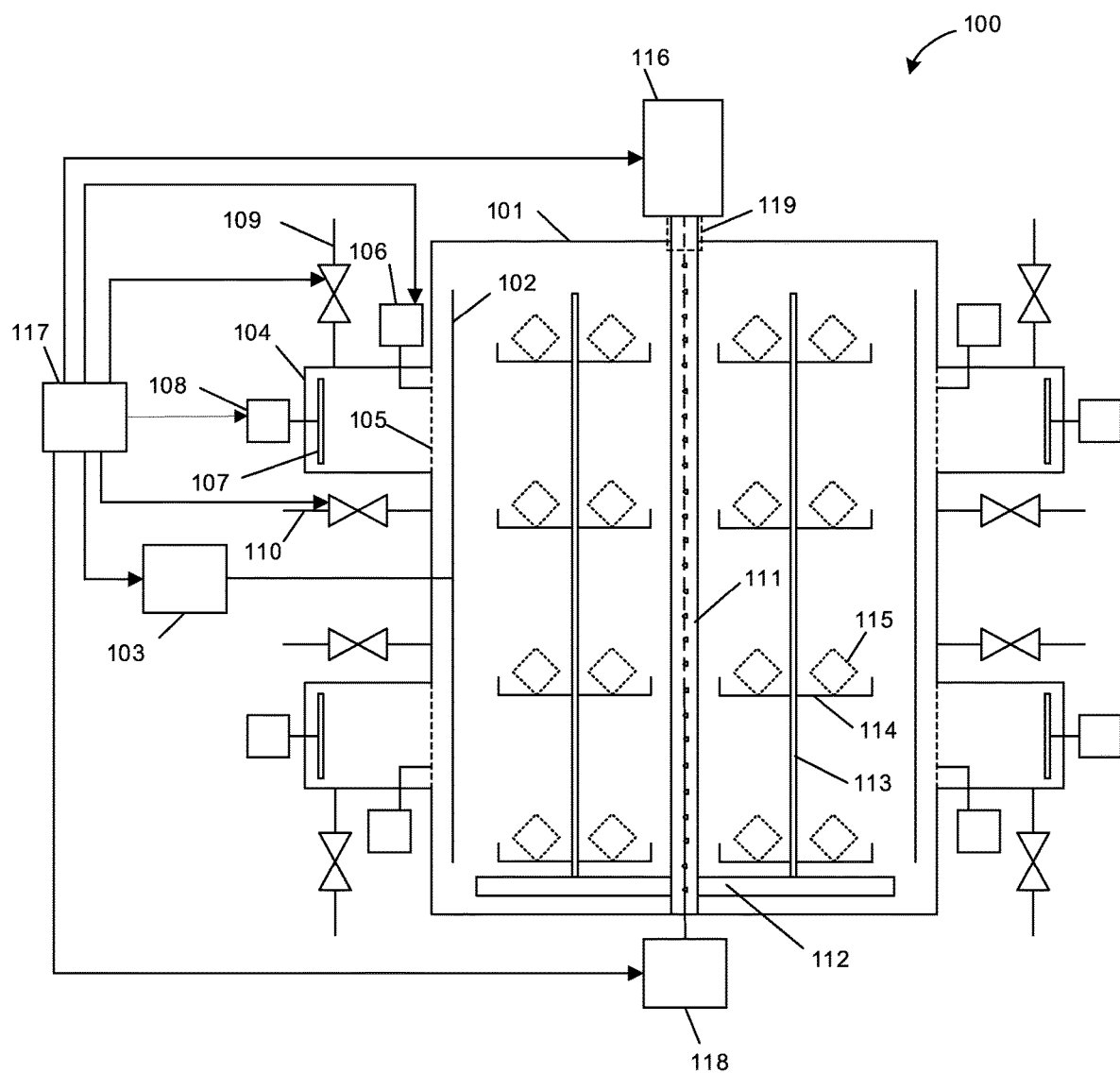
FIG. 1 is a schematic front sectional view of the structure of an example plasma polymerization coating apparatus with planetary rotation axles arranged on the rotation rack, according to one or more embodiments of the present disclosure.

Certain embodiments of the present disclosure will be described in detail below in reference to the related technical solutions and accompanying drawings. In the following description, specific details are set forth to provide a thorough understanding of the presently disclosed technology. In other embodiments, the techniques described here can be practiced without these specific details. In other instances, well-known features, such as specific fabrication techniques, are not described in detail in order to avoid unnecessarily obscuring the present technology. References in this description to "an embodiment," "one embodiment," or the like mean that a particular feature, structure, material, or characteristic being described is included in at least one embodiment of the present disclosure. Thus, the instances of such phrases in this specification do not necessarily all refer to the same embodiment. On the other hand, such references are not necessarily mutually exclusive. Furthermore, the particular features, structures, materials, or characteristics can be combined in any suitable manner in one or more embodiments. Also, it is to be understood that the various embodiments shown in the figures are merely illustrative representations and are not necessarily drawn to scale.

As previously mentioned, plasma polymerization coating is capable of producing results with highly desirable characteristics and can perform well in certain applications, such as hydrophobic film coating. However, since the polymer coating tends to be very thin, it can be difficult to achieve the desired uniformity of the coating.

To perform plasma polymerization coating, a device to be treated can be first placed in a vacuum chamber, and then carrier gas and gaseous organic monomer are dispersed into the vacuum chamber. The gaseous organic monomer is turned into a plasma state by discharging electrical power to the monomer to produce various types of reactive species. Next, additional reactions between the reactive species and the monomer, or between the reactive species themselves, take place and form a polymer film on the device's surface. At various points in the plasma polymerization coating process, the atmosphere of the vacuum chamber may include one or more of: carrier gas, gaseous organic monomer, plasma resulting from discharging electrical power to the monomer, reactive species resulting from the combination of plasma and monomer vapor, etc. In certain applications such as hydrophobic or oleophobic film coating, plasma polymerization coating is capable of producing results with highly desirable characteristics.

Conventional plasma coating devices are typically equipped with a rectangular vacuum chamber, and as a result, during the coating process, the positions of the device-carrying platforms and the device placed thereon are typically fixed within the conventional vacuum chamber. Because different devices in the same batch are in different positions in the vacuum chamber, they are at varying distances from the electrodes, monomer/carrier gas outlet, vacuum gas outlet, etc. Accordingly, it is inevitable that the thickness of the coats applied to each device vary based on the different locations of each device within the chamber. Hence, in order to reduce the variation in uniformity within the same batch, currently available plasma coating devices typically adopt a vacuum chamber with a small volume and are treated in small-quantity batches. This process greatly reduces processing efficiency and increases the cost. Even so, it may fail to produce a satisfactory batch uniformity that meets a client's requirement. With the rapid expansion of polymer coating applications, demands for such processing are increasing rapidly.

Accordingly, disclosed here are plasma coating apparatus and techniques that address the technical problems in the existing plasma coating processes, such as small batch size, low efficiency, high cost, and poor batch uniformity. In some embodiments, the uniformity of the applied plasma polymerization coating is enhanced using control mechanisms such as controlling the evacuation of gases from a vacuum chamber.

Plasma chemical vapor deposition (PCVD) is a technology that uses plasma to produce a protective coating on the surface of a device. The PCVD process activates a reaction gas and promotes chemical reactions on the surface or proximity of a device to produce a protective coating.

PCVD is a process that offers numerous advantages during the production of a protective coating. For example, PCVD is a dry process that does not damage the device receiving the coating. When compared with a parylene vapor deposition method, the PCVD technology has a lower deposition temperature to avoid damage to the device receiving the coating while offering greater control of the monomers used and the coating structure formed. Additionally, the coating can be applied evenly on non-uniform or irregularly shaped devices.

Additionally, the coating processing can be conducted on gold fingers and other conducting members of a device because the coating does not affect a product's normal functions such as current conduction, heat dissipation, and data transmission. Therefore, a masking operation is not necessary to control which areas of a device will receive the plasma polymerization coating. Therefore, the simplified coating process can improve production throughput and higher production yields. Finally, PCVD technology is more environmentally friendly than applying a three-coating protection layer using liquid chemicals because of the reduced number of undesired byproducts.

In addition to the advantages during production, PCVD produces a protective coating that has significant advantages over coatings produced using other methods. For example, relative to conventional water resistance protection through a mechanical structure (e.g., glue coating, rubber rings, and gaskets), the protection provided by the plasma polymer film avoids complex mechanical designs, high cost, low production yield, and susceptibility to deterioration from wear and tear. Additionally, by avoiding mechanical structures to provide water resistance, the PCVD protective coating improves the appearance of the product and improves user experience.

Another advantage of the coating is the strong bonding force to the device that allows the coating to remain on the surface of the device while sustaining normal wear and tear. The coating also has stable chemical and physical properties that provides resistance to damage from solvents, chemical corrosion, heat, and abrasion. Additionally, the PCVD process is capable of generating coatings that are that can be as thin as a few nanometers. Therefore, relative to other coatings, the plasma polymer film provides an effective method for providing a water resistant and corrosion resistant coating that is thin and durable. In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure.

The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication (e.g., a network) between components. The present embodiments are not to be construed as limited to specific examples described herein but rather to include within their scope all embodiments defined by the appended claims.

Plasma Polymerization Coating Apparatus

Figure 2:
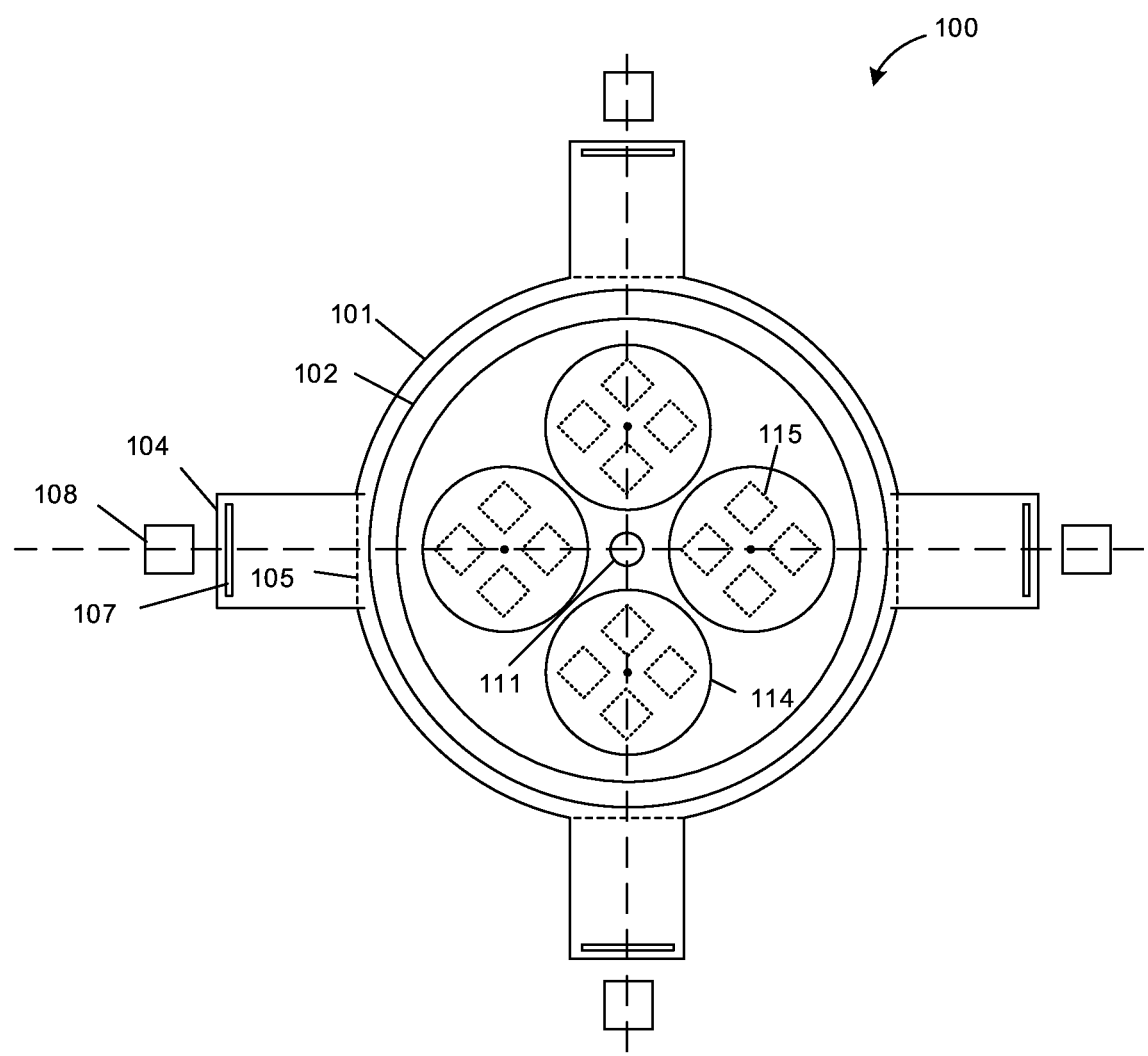
FIG. 2 is a schematic top view of the structure of the example apparatus shown in FIG. 1, according to one or more embodiments of the present disclosure.

Shown in FIGS. 1 and 2 is a plasma polymerization coating apparatus 100 according to one or more embodiments of the present disclosure for applying a plasma polymerization coating to device 115. In an example embodiment, the plasma polymerization coating apparatus includes vacuum chamber 101, porous electrode 102, radio frequency power source 103, discharge cavity 104, metal grid 105, pulse power source 106, discharge source 107, discharge power source 108, carrier gas pipe 109, monomer vapor pipe 110, tail gas collecting tube 111, rotation rack 112, planetary rotation shafts 113, planetary rotation platforms 114, device 115 to be treated, vacuum pump 116, controller 117, rotary motor 118, and guide sleeve 119.

In some embodiments, device 115 may be a connector for transmitting electrical signals. The connector may be an interface used to connect two or more devices and allow electrical signals to be transmitted between the connected devices. In some embodiments, the connector may be a USB™ connector (for example, Micro USB™, USB-A™, USB™ Type-C connector, micro-USB™ connector, etc.), an Apple™ Lighting connector, a HDMI™ connector, a flexible printed circuit (FPC) connector, a board-to-board (BTB) connector, a probe connector, or a radio frequency (RF) coaxial connector. In other embodiments, device 115 may be a household appliance, a mobile device, a computing device, a display device, or a wearable device. In some examples, device 115 is a cell phone, headphone, wireless headphone, tablet computer, child watch, positioning tracker, laptop computer, audio system, unmanned aerial vehicle, augmented reality (AR) glasses, or virtual reality (VR) glasses.

Device 115 may gain improved durability and performance by undergoing a plasma polymerization processing. Durability and resilience to wear and tear is important because the device 115 may encounter frequent plug and unplug events and operate in harsh environments that increase the likelihood of moisture and corrosion damage. Therefore, as will be described in detail below, a plasma polymerization coating provides protection against the various wear and tear encountered by device 115. For example, a plasma polymerization coating may provide a layer of protection that makes device 115 resistant to water and moisture (e.g., condensation due to changes in temperature). Additionally, the plasma polymerization coating may provide protection against acidic solvents, acidic atmospheres, and basic solvents. Finally, the plasma polymerization coating may also provide protection or resistance against sweat, cosmetics, and frequent changes of temperatures.

Vacuum Chamber

Vacuum chamber 101 functions as a container where polymerized plasma may be applied to device 115. For purposes of the present disclosure, the term "vacuum chamber" means a chamber having a lower gas pressure than what is outside of the chamber (e.g., as a result of having vacuum pump 116 pumping gas out of the chamber). The term does not necessarily mean that the chamber is exhausted to a vacuum state. For the purposes of discussion herein, vacuum chamber 101 may also be referred to as a "reaction chamber." Vacuum chamber 101 may be a chamber where one or more chemical reactions described herein (e.g., for implementing the disclosed plasma coating techniques) take place. In some examples, during the coating process, vacuum chamber 101 can be first exhausted of gas to a base pressure around 5 mTorr and then filled with carrier gas. After filling vacuum chamber 101 with carrier gas, the air pressure in the vacuum chamber 101 may rise to around tens of mTorr. The volume of vacuum chamber 101 may vary depending on the application, for example, between 50-3000 liters. Examples of the chamber material may include aluminum alloy or stainless steel.

Vacuum chamber 101 has a chamber body inner wall along the perimeter of vacuum chamber 101. The inner wall of vacuum chamber 101 may be characterized by a circular top view cross section with the same diameter as other top view cross sections, or a polygon with the same edge length as other top view cross sections. Some embodiments of said polygon have at least six edges.

The top cover and the bottom cover of vacuum chamber 101 may be a flat plate or an arched structure, such as a spherical segment, a regular polygon, or an oval. In some embodiments, the structure matches the top view cross section of the chamber body inner wall of vacuum chamber 101.

Porous Electrode

In some embodiments, porous electrode 102 can generate plasma for pre-treating the surface of the device 115 to be coated by polymerization in subsequent steps. In particular, high electricity power (e.g., over 600 watts) are continuously discharged through porous electrode 102 to produce a strong plasma. The resulting plasma can be used for at least two purposes: (1) cleaning organic impurities on the substrate surface, such as water and oil stains, as well as (2) activating organic substrate to form dangling bonds to facilitate coating deposition and enhance the binding force between the substrate and the coating. In some embodiments, this surface plasma pre-treatment via porous electrode 102 is optional.

In some embodiments, the porous electrode 102 may form a cylindrical shape or at least divided into two sections of cylindrical shape, and the porous electrode 102 can be coaxial with the vacuum chamber 101. The porous electrode 102 can be covered by holes, and the size of a hole can range between 2 to 30 mm in diameter. The space between each hole can range from 2 to 30 mm. Additionally, the holes may be arranged in a uniform manner or with varying distances between each hole.

Porous electrode 102 is installed in vacuum chamber 101 near or proximal to the inner wall of vacuum chamber 101. Porous electrode 102 may form a porous arched structure within a distance from the inner wall of vacuum chamber 101. In some embodiments, the distance from porous electrode 102 to the inner wall of vacuum chamber 101 can range between 1 to 6 cm.

Vacuum chamber 101 of the plasma polymerization coating apparatus 100 may include a radio frequency power source 103 coupled to porous electrode 102. In some embodiments, the radio frequency power source 103 is configured to provide an electrical charge to the porous electrode 102 to produce a treatment plasma to remove impurities from the surface of the one or more substrates. The radio frequency power source 103 can be coupled to controller 117 to receive a radio frequency control signal that controls the power output to the porous electrode 102.

For example, porous electrode 102 may be connected to a radio frequency (e.g., high frequency) power source 103. When power from radio frequency power source 103 is applied to porous electrode 102, plasma is generated for removing impurities from the surface of device 115. The power of radio frequency power source 103 may be configured to be between 15-1500 watts. Note that, in some embodiments, the plasma generated during power discharge can be used for substrate surface cleaning and pre-treatment. According to some embodiments, the gas that is used to produce plasma for cleaning (e.g., pre-treating the surface of the substrate) contains oxygen.

As mentioned above, radio frequency power source 103 is applied to porous electrode 102 to generate a plasma for removing impurities from the surface of device 115. In one or more embodiments, radio frequency power source 103 is used for driving the electrical discharge even when and if porous electrode 102 is covered by dielectric coatings. In comparison, direct current (DC) power sources or low frequency power sources (e.g., under 50 Hz) do not have this advantage. The applicable high frequency applied by radio frequency power source 103 may range from tens of kHz to several GHz. Typical high frequencies include 40 kHz, 13.56 MHz, and 2.45 GHz, etc. The choice of the frequency may depend on the technical requirement or specification, the existing products' material characteristics, and cost. It is noted that a person having ordinary skill in the art of dielectric coating should be able to select a suitably high frequency to perform the coating of a specific material.

Additionally, because electrodes of radio frequency power source 103 alternates in polarity, the electrodes are identified as the driving electrodes and the grounding electrodes instead of the cathode and anode electrodes. In one or more embodiments of the disclosed apparatus, porous electrode 102, which connects to the output of the radio frequency power source 103, is the driving electrode. In at least some of these embodiments, the wall of vacuum chamber 101 can act as the grounding electrode. Additionally, or alternatively, tail gas collecting tube 111 can also act as the grounding electrode.

Discharge Cavity

Vacuum chamber 101 of the plasma polymerization coating apparatus 100 includes a dispersal mechanism positioned around a perimeter of vacuum chamber 101. In some embodiments, vacuum chamber 101 is configured to disperse reactive species into vacuum chamber 101 in a substantially uniform manner. The dispersal mechanism can be configured to disperse reactive species toward the central axis of vacuum chamber 101, such that the reactive species form a polymeric coating on surfaces of the one or more substrates. The dispersal mechanism may include a discharge cavity 104 and a metal grid 105 configured to create a pressure differential between the discharge cavity and vacuum chamber 101. The metal grid 105 may also be configured to reduce or prevent gas backflow from vacuum chamber 101 to the discharge cavity.

In some embodiments, discharge cavity 104 is connected to vacuum chamber 101. Discharge cavity 104 includes discharge source 107 coupled to a discharge power source 108 to produce plasma for polymerization. One end of discharge source 107 can be connected to a discharge power source 108. The other end of the carrier gas pipe 109 may be adjacent to a carrier gas source. Monomer vapor pipe 110 can be coupled to vacuum chamber 101, and an outlet thereof can be located in front of discharge cavity 104. The other end of monomer vapor pipe 110 can be connected to a monomer vapor source.

In some embodiments, discharge cavity 104 may form a cylindrical shape, and can be made from materials including, for example, aluminum, carbon steel, or stainless-steel material. The diameter of discharge cavity 104 can range from 5 to 20 cm, the depth from 3 to 15 cm, and the distance between two neighboring discharge cavities from 7 to 40 cm. The axes of discharge cavity 104 may be orthogonal to the axis of the vacuum chamber 101 to provide the largest opening area to the plasma to travel to the vacuum chamber 101. In alternate embodiments, under the pressure of several Pascal in the process, free diffusion dominates the plasma propagation, so the orientation of the discharge cavity has little importance.

Various size ratios between the discharge cavity and the vacuum chamber. For example, a single, relatively large discharge cavity 104 allows for dispersal of a greater volume of carrier gas-based plasma. However, a single discharge cavity provides for carrier gas-based plasma from a single direction into the vacuum chamber 101 and thus does not provide adequate uniformity of the polymerization coating. Conversely, the number and distribution of the discharge cavities is determined by the desired coating uniformity. Smaller discharge cavities 104 that are uniformly distributed provide greater uniformity of the applied coating. However, too many small discharge cavities present technical limitations and increased costs. The final design should be optimized to provide a balance of uniformity, technical limitations, and cost.

Discharge cavity 104 is provided with carrier gas pipe 109 that introduces carrier gas from a carrier gas source to discharge cavity 104. The carrier gas gets ionized in discharge cavity 104 and becomes plasma (i.e., a mixture of positive ions and electrons produced by ionization). The carrier gas transfers energy to the monomer vapor to activate the monomer vapor to a high-energy state (i.e., the monomer vapor become activated species). In some embodiments, the carrier gas may even cause some chemical bonds of the monomer to break and form reactive particles such as free radicals.

When the carrier gas encounters an electrical discharge from discharge power source 108 at discharge source 107, the carrier gas forms a plasma. During the coating process, discharge cavity 104 discharge at a relatively low power to generate weak plasma. The weak plasma is intermittently released into vacuum chamber 101 by metal grid 105 to initiate monomer polymerization and deposition on the surface of the substrate to form a polymerization coating. Depending on the embodiment, discharge source 107 may be a lamp filament, an electrode, an induction coil, or a microwave antenna. Discharge source 107 can have discharge power ranging from 2 to 500 W.

Depending on the embodiment, the porous electrode 102 and discharge cavity 104 are independent of each other, and they can be operated either together or separately. In some embodiments, during the plasma polymerization coating process, the porous electrode 102 is used for (1) pretreatment of the samples and (2) post-cleaning of the chamber. That is to say, in these embodiments, the porous electrode 102 do not operate during coating process. On the other hand, according to one or more embodiments, discharge cavity 104 is mainly used for coating. Additionally, or alternatively, discharge cavity 104 can also be used for post-cleaning of the cavities themselves.

For purposes of the disclosure here, the term "strong plasma" is associated with the higher power applied by radio frequency power source 103 relative to the power applied by discharge power source 108. The typical discharge power for strong plasma can be several hundred watts, and the plasma density is between $10^9$-$10^{10}$/cm$^3$. Conversely, the term "weak plasma" is associated with the lower power applied by discharge power source 108 relative to the power applied by radio frequency power source 103. Typical discharge power for weak plasma can be several watts to tens of watts, and the plasma density is between $10^7$-$10^8$/cm$^3$. Example materials for the monomer containing acrylate, such as ethoxylated trimethylolpropane triacrylate, or perfluorocyclohexyl methyl acrylate.

Metal Grid

Under general vacuum conditions, a pressure gradient may exist along the way from the gas inlet to the exhaust exit, even if no mesh exists. This can be measured by vacuum meters at different positions of the vacuum chamber 101. Therefore, the strategic placement of the metal grid 105, such as introduced here, can increase the pressure difference between discharge cavity 104 and vacuum chamber 101 by hindering the carrier gas flow. Generally speaking, the pressure difference may increase with the number of layers, the mesh number, and transmissivity of the grid. In some embodiments, each layer may have different characteristics. For example, one layer may have smaller openings while another layer has larger openings. Additionally, there may be a preferred order for the gates (e.g., the carrier gas-based plasma moves through a gate with larger openings before moving through a gate with smaller openings).

In some embodiments, the number of layers of metal grid 105 can range from 2 to 6. Metal grid 105 can be made of materials including, for example, stainless steel or nickel. Metal grid 105 ranges from 100 to 1,000 mesh, and the transmissivity can range from 25% to 40%. Metal grid 105 increases the pressure differential to reduce or to prevent backflow of carrier gas from vacuum chamber 101 to discharge cavity 104. In some embodiments, at least two layers of metal grid 105 are provided at the connecting positions of the discharge cavities and the inner walls of vacuum chamber 101. Metal grid 105 may be insulated from the inner wall of vacuum chamber 101.

In certain embodiments, metal grid 105 may be arranged at the connecting positions of the discharge cavities and the inner walls of vacuum chamber 101. In some embodiments, at least two discharge cavities 104 are provided on an outer wall of the vacuum chamber 101 in a sealed manner. In some examples, the porous electrode 102 and the discharge cavities are able to discharge together or separately according to the needs of the specific processes.

In one or more embodiments, a pulse power source 106 is coupled to the metal grid 105. The pulse power source 106 can be configured to provide a positive electrical charge to the metal grid 105 in pulses, wherein plasma in the discharge cavity is blocked from entering vacuum chamber 101 during a pulse-off period. The plasma in the discharge cavity can be passed through to vacuum chamber 101 during a pulse-on period.

As a result, when power is applied, the plasma generated in discharge cavity 104 is released into vacuum chamber 101. For example, the plasma is blocked (at least partially) by metal grid 105 within discharge cavity 104 during a period of pulse-off (i.e., when no power is applied to metal grid 105), and the plasma can pass through metal grid 105 during a period of pulse-on (i.e., when power is applied to metal grid 105) into vacuum chamber 101. In some embodiments, pulse power source 106 outputs a positive pulse with the following parameters: peak is from 20 to 140 V, pulse width is from 2 μs to 1 ms, and repeat frequency is from 20 Hz to 10 kHz.

Similarly, the metal grid 105 can place a hindering effect on the reverse-diffusion of the monomer vapor from the vacuum chamber 101 to discharge cavity 104. Moreover, since the pressure in the discharge cavity 104 can be higher than that in the vacuum chamber 101, the monomer vapor may not easily move from the vacuum chamber 101 to the discharge cavity 104 through reverse-diffusion, thereby preventing the monomer vapor from being excessively decomposed and destructed by the continuously discharged plasma in the discharge cavity 104. In some embodiments, the metal grid 105 can help create a pressure differential, so as to reduce or to prevent the carrier gas from backflowing.

Monomer Vapor Pipe

Monomer vapor pipe 110 can be connected to vacuum chamber 101, and an outlet can be located adjacent to discharge cavity 104. The other end of monomer vapor pipe 110 is connected to a monomer vapor source. In some embodiments, distance between the outlet of monomer vapor pipe 110 and discharge cavity 104 can range from 1 to 10 cm. In one embodiment, the monomer vapor pipe 110 is directly connected to vacuum chamber 101 rather than within discharge cavity 104. This is to avoid the monomer vapor from being exposed to strong electrical charges from the discharge cavity 104.

In some embodiments, no monomer vapor is introduced into vacuum chamber 101 when porous electrode 102 is activated during the pre-treatment period (e.g., step 306). During the plasma polymerization coating period, the monomer vapor may be partly discharged in and out of discharge cavity 104. However, discharge of monomer vapor into discharge cavity 104 may be undesirable because it may lead to excess breakdown of the monomer molecules. Thus, the monomer vapor pipe 110 may be designed to be directly connected to vacuum chamber 101 to avoid the monomer vapor from being strongly discharged in discharge cavity 104 when passing through it. Rather, the carrier gas-based plasma is intermittently released from the discharge cavities to activate the monomer vapor with minimized discharge of it.

Tail Gas Collecting Tube and Vacuum Pump

Vacuum chamber 101 of the plasma polymerization coating apparatus 100 may include a tail gas collecting tube 111 positioned vertically along the central axis of vacuum chamber 101. In some embodiments, vacuum chamber 101 is operable to have an air pressure lower than vacuum chamber 101 to collect excess reactive species in the atmosphere of vacuum chamber 101 at a controlled exhaust rate.

One or more ends of the tail gas collecting tube 111 may be hollow and connected to vacuum pump 116 at a gas exhaust port. Additionally, holes are distributed along the wall of tail gas collecting tube 111. Atmosphere in vacuum chamber 101 enters the tail gas collecting tube 111 via the holes on the tail gas collecting tube 111 and is then discharged from vacuum chamber 101 by vacuum pump 116. The power applied to vacuum pump 116 may range between 3-50 kW, and the pump rate may range between 600-1200 $m^3/h$. The inner diameter of tail gas collecting tube 111 may range from 25 to 100 mm. In some embodiments, holes can be evenly provided on the wall of tail gas collecting tube 111. The hole size may range from 2 to 30 mm, and the space between holes may range from 2 to 100 mm.

The vacuum pump 116 may be configured to evaluate the atmosphere from vacuum chamber 101 via tail gas collecting tube 111. The operation of the vacuum pump 116 may be controlled by receiving control signals from controller 117 that indicate the pump rate at which the atmosphere of vacuum chamber 101 is evacuated.

Vacuum pump 116 may receive control signals that initiate the operation of vacuum pump 116 to evacuate the atmosphere in vacuum chamber 101. This may be performed prior to the discharge of carrier gas or monomer vapor in order to remove any undesired gases, plasma, reactive species, or contaminants before applying the plasma polymerization coating to device 115. For example, when there is an excessively high concentration of reactive species in vacuum chamber 101, control signals may be received from controller 117 indicating that the vacuum pump 116 should operate at a maximum pump rate (e.g., 1200 $m^3/h$). In contrast, when there is a lower concentration of reactive species, a minimum pump rate (e.g., 600 $m^3/h$) may be used or operation of vacuum pump 116 may be halted.

Additionally, vacuum pump 116 may receive control signals that control the pump rate used to evacuate the atmosphere in vacuum chamber 101 during the plasma polymerization coating process. In some examples, the generation of reactive species may result in varying concentrations of reactive species at local regions within vacuum chamber 101.

In one example, the concentration of reactive species may be affected by the amount or rate in which monomer vapor is introduced into vacuum chamber 101. If the monomer vapor is rapidly introduced, an excessive amount of reactive species may form within vacuum chamber 101. In addition to the overall amount of reactive species, a high local concentration of reactive species may form in a region where more monomer vapor is introduced.

In another example, the generation of reactive species may be affected by the rate and/or level of power of electrical discharge applied to carrier gas. The greater rate or higher the power, the greater the amount of plasma may be generated overall. Additionally, the opening of the discharge cavity 104 where the electrical discharge is applied to carrier gas may hold a greater local concentration of plasma. As the plasma converges with monomer vapors, the greater local concentration of plasma may in turn result in a greater local concentration of reactive species.

In yet another example, the generation of reactive species may be affected by the rate in which energy is transferred from the plasma to the monomer vapor. For example, the local concentration within vacuum chamber 101 where the plasma and monomer vapor meet may increase if the rate in which energy is transferred from the plasma to the monomer vapor is high. Additionally, the local concentration of reactive species may increase in a region where there is an ideal amount of plasma and monomer that converge.

For another example, the concentration of reactive species may be affected by the deposition of reactive species on device 115. As the reactive species are deposited on device 115, less reactive species remains in the atmosphere of vacuum chamber 101. Therefore, as reactive species moves from the outer regions of vacuum chamber 101 towards the central axis and gets deposited on device 115, a gradient may form where the concentration of reactive species in the atmosphere decreases towards the central axis of vacuum chamber 101. In an example of a countervailing effect, the concentration of reactive species in the atmosphere increases as the reactive species converges towards the central axis of vacuum chamber 101. A person of ordinary skill in the art will recognize that various other factors may affect the concentration of reactive species in vacuum chamber 101. For example, the concentration of reactive species may be affected by the ratio of plasma to monomer vapors.

Based upon the various factors affecting the generation of reactive species described above, an uneven or undesired level of concentration of reactive species may form within vacuum chamber 101. In some embodiments, the pump rate of vacuum pump 116 may be controlled to compensate for the uneven or undesired level of concentration of reactive species. Vacuum pump 116 may receive control signals to increase the pump rate to decrease the overall amount of reactive species within vacuum chamber 101. Additionally, vacuum pump 116 may receive control signals to reduce a greater concentration of reactive species at a local region such as where the plasma and monomer vapor converges.

For example, the pump rate may be increased to eliminate an increase in the local concentration of reactive species where the plasma and monomer vapor converges. In another example, the pump rate may be reduced to eliminate a reduced local concentration of reactive species where the electrical power applied to carrier gas is lowered. A person of ordinary skill in the art will recognize that the vacuum pump 116 may be configured in various ways to enhance the uniformity of reactive species in vacuum chamber 101. For example, the timing, periodic operation, and gradual increase/decrease of pump rates may be controlled to compensate for changes in the concentration of reactive species or to compensate for local regions with varying reactive species concentrations.

Hollow Guide Sleeve

In some embodiments, one end of the tail gas collecting tube 111 may be connected to hollow guide sleeve 119. The hollow guide sleeve 119 may be configured as a support structure that allows tail gas collecting tube 111 to rotate along the central axis of vacuum chamber 101. In some examples, the tail gas collecting tube 111 may be inserted into the hollow guide sleeve. This may be accomplished by configuring the inner diameter of the hollow guide sleeve 119 to be equal or larger than the outer diameter of tail gas collecting tube 111. A person of ordinary skill in the art would recognize that the hollow guide sleeve 119 may be configured in other ways to function as a support structure. For example, hollow guide sleeve 119 may be configured to be inserted into tail gas collecting tube 111. This may be accomplished by configuring the outer diameter of the hollow guide sleeve 119 to be equal or smaller than the inner diameter of tail gas collecting tube 111.

Rotation Rack

Vacuum chamber 101 of the plasma polymerization coating apparatus 100 may include rotation rack 112 operably coupled to a planetary rotation shafts 113 and configured to rotate along a central axis. In some embodiments, the primary rotation rack includes one or more rack layers, each rack layer holding a plurality of substrate platforms from the one or more substrate platforms. In some embodiments, the primary rotation shaft may be coupled or otherwise integrated with tail gas collecting tube 111.

In some embodiments, rotation rack 112 is coupled to one or more planetary rotation shafts 113 that is in turn coupled to rotation platforms 114. The planetary rotation shafts 113 may support planetary rotation platforms 114 that rotate along a secondary axis which is coaxial with planetary rotation shafts 113. Additionally, the planetary rotation shafts 113 may be distal to the central axis of vacuum chamber 101. The rotation of the primary rotation rack along the central axis and the rotation of the secondary rotation rack along the secondary axis can provide the same rate of spatial movement for each of the one or more substrates during the coating process in order to achieve uniform coating. In some examples, the number of the planetary rotation shafts 113 may be between 2 to 8, and the number of the planetary rotation platforms 114 may be between 1 to 10.

Vacuum chamber 101 of the plasma polymerization coating apparatus also includes one or more substrate platforms configured to carry the one or more substrates that are to receive the plasma polymerization coating. Each substrate platform can be located on the secondary rotation rack. The substrate platforms may be planetary rotation platforms 114. Planetary rotation platforms 114 allow for placement of device 115 to be treated such that the device 115 is in continuous movement along vacuum chamber 101. The planetary rotation platforms 114 are secured along planetary rotation shafts 113, wherein each planetary rotation platforms 114 rotates around their own planetary rotation axes while the planetary rotation axes rotate around the central axis of vacuum chamber 101. The continuous movement allows for uniform plasma polymerization treatment on the surface of device 115.

Note that, even though there is no particular directional requirement for the rotation of planetary rotation shafts 113 versus the rotation of rotation rack 112, overall the rotations should be suitably tuned and adjusted (e.g., for the sake of rotational balance and stability) such that substantially all samples can experience the same spatial movement during the coating process in order to achieve uniform coating. Similarly, there is no particular limitation on the rotational speed; however, it is apparent that an overly fast rotational speed is unfavorable because of the unnecessary power consumption, part wear, as well as instability of the platform.

Polymerization Controller

In some embodiments, plasma polymerization coating apparatus 100 includes controller 117 configured to provide control signals the regulate the operation of the various components of plasma polymerization coating apparatus 100. The control signals allow the apparatus to regulate the plasma polymerization process applied to device 115.

Controller 117 may transmit a rotation rate signal to rotary motor 118. The rotation rate signal indicates the rotational speed that rotary motor 118 should operate. Regulating the rotational speed may determine the rate that device 115 traverse vacuum chamber 101. For example, a faster rotational speed may allow the substrate to traverse vacuum chamber 101 relatively quickly. Therefore, any imbalance of the concentration of plasma in the vacuum chamber 101 would be negated because device 115 would be rapidly exposed to both ends of the plasma concentration gradient.

In some embodiments, the dispersal mechanism is communicatively coupled to the controller 117 to receive dispersal control signals from the controller to control the dispersal rate of the reactive species in a substantially even manner on the one or more substrates. The dispersal control signal controls the dispersal rate of the reactive species by regulating the applied electrical power to the dispersal mechanism and/or by regulating the rate of gas that enters the dispersal mechanism for polymerization. In some embodiments, the dispersal rate control signal adjusts the dispersal rate to account for the density decrease in the reactive species within vacuum chamber 101 resulting from the deposition of the reactive species on to the one or more substrates and the density increase within the reactive species in vacuum chamber 101 resulting from the reactive species converging toward the center of the chamber such that the density of reactive species across vacuum chamber 101 is uniform.

For example, controller 117 may transmit a dispersal control signal to discharge power source 108 to indicate the power that should be applied to discharge source 107. Regulating the power applied to discharge source 107 allows for control of the rate in which plasma is generated in discharge cavity 104. Therefore, a change in the power to discharge source 107 may affect a change in the density of plasma as well as the properties of the plasma in vacuum chamber 101 and ultimately the thickness of the plasma applied to device 115.

In some embodiments, the pulse power source receives a pulse control signal from the controller, the pulse control signal regulating the power and frequency of the positive electrical charge. Specifically, controller 117 may transmit a pulse control signal to pulse power source 106. The pulse control signal indicates the power to be applied by pulse power source 106 to metal grid 105. Specifically, pulse power source 106 applies a positive electrical pulse bias on metal grid 105, thus allowing the plasma generated in discharge cavity 104 to be intermittently released into vacuum chamber 101. For example, metal grid 105 may block the plasma within the discharge cavity 104 during a period of pulse-off, and metal grid 105 may allow plasma to pass into vacuum chamber 101 during a period of pulse-on. Using this mechanism, the pulse control signal controls the duration and frequency in which plasma is allowed to enter from discharge cavity 104 to vacuum chamber 101.

Controller 117 may transmit a radio frequency power control signal to radio frequency power source 103. The radio frequency power signal indicates to radio frequency power source 103 when to apply power to porous electrode 102 to generate plasma for removing impurities from device 115. For example, controller 117 may transmit a radio frequency power control signal to power on radio frequency power source 103 at the start of a plasma polymerization process to pre-treat device 115 or after the plasma has been applied to the substrate for post-treatment of device 115 and vacuum chamber 101.

Controller 117 also transmits various control signals for regulating the introduction and evacuation of gases into the planetary rotary rack device. For example, controller 117 transmits a carrier gas control signal to carrier gas pipe 109. This control signal indicates the rate in which carrier gases should be introduced into discharge cavity 104. Controller 117 also transmits a monomer vapor control signal to monomer vapor pipe 110. The monomer vapor control signal indicates the rate in which monomer vapor gases are introduced into vacuum chamber 101.

In some embodiments, a collecting tube is communicatively coupled the controller to receive an exhaust rate control signal from the controller to control the exhaust rate of the reactive species. For example, controller 117 provides a tail gas control signal to tail gas collecting tube 111. This signal controls the rate in which the atmosphere is evacuated from vacuum chamber 101. In some embodiments, the controller transmits the exhaust rate control signal to adjust the rate the reactive species is exhausted from vacuum chamber 101. The exhaust rate is controlled to account for two factors contributing to the density of the reactive species within vacuum chamber 101: (1) the density decrease in the reactive species within vacuum chamber 101 resulting from the deposition of the reactive species on to the one or more substrates and (2) the density increase in the reactive species in vacuum chamber 101 resulting from the reactive species converging toward the center of the chamber such that the density of reactive species across vacuum chamber 101 is uniform, (3) the increase in reactive species within vacuum chamber 101 based on the rate in which monomer vapor is introduced into the reaction chamber, (4) the increase in reactive species within vacuum chamber 101 based on the rate in which electrical power is applied to carrier gas to generate plasma, and (5) the increase in reactive species within vacuum chamber 101 based on the rate in which energy from the plasma is transferred to the monomer vapor.

Controller 117 may be microcontrollers, general-purpose processors, or may be application-specific integrated circuitry that provides arithmetic and control functions to implement the techniques disclosed herein. The processor(s) may include a cache memory (not shown for simplicity) as well as other memories (e.g., a main memory, and/or non-volatile memory such as a hard-disk drive or solid-state drive. In some examples, cache memory is implemented using SRAM, main memory is implemented using DRAM, and non-volatile memory is implemented using Flash memory or one or more magnetic disk drives. According to some embodiments, the memories may include one or more memory chips or modules, and the processor(s) on Controller 117 may execute a plurality of instructions or program codes that are stored in its memory.

Rotary Motor

In some embodiments, plasma polymerization coating apparatus 100 includes rotary motor 118 to rotate device 115 within vacuum chamber 101. The rotation of device 115 enhances the uniformity of the applied plasma polymerization coating on device 115. In some embodiments, rotary motor 118 actuates the rotation of rotation rack 112 coupled to tail gas collecting tube 111 such that planetary rotation platforms 114 rotate along a concentric path relative to the central axis of vacuum chamber 101. Additionally, rotary motor 118 may actuate the rotation of the substrate platforms along the planetary rotation axes along planetary rotation shafts 113. As noted above, control signals from controller 117 may be used to control the rate that rotary motor 118 operates to rotate rotation rack 112 and/or planetary rotation shafts 113. In some examples, the rotational frequency may range from 10 Hz to 50 Hz. Additionally, in some embodiments, the rotational frequency may be adjusted dynamically during the plasma polymerization coating process (e.g., process 300).

Rotary motor 118 may be located in various locations relative to vacuum chamber 101. For example, rotary motor 118 may be located below vacuum chamber 101 and coupled to the lower end of tail gas collecting tube 111. In other examples, rotary motor 118 may be located at the center of vacuum chamber 101 and coupled to the middle of tail gas collecting tube 111. In yet other examples, rotary motor 118 may be located above vacuum chamber 101 and coupled to the upper end of tail gas collecting tube 111. Additionally, rotary motor 118 may be located within vacuum chamber 101 or outside of vacuum chamber 101.

FIG. 2 is a schematic top view of the structure of plasma polymerization coating apparatus 100 shown in FIG. 1, according to one or more embodiments of the present disclosure.

Overall, the present disclosure has various beneficial effects. First, the apparatus employs a central axis symmetrical vacuum chamber 101 structure to maintain the uniformity of space polymerization reactive material density. The vacuum chamber 101 adopts a mechanism in which the gas is fed via the side wall, transported radially, and discharged along the direction of central axis.

In one or more embodiments, the carrier gas pipe 109 is provided in each discharge cavity 104 and with an outlet. A carrier gas can enter the discharge cavities via carrier gas pipe 109, and then diffuse into the vacuum chamber 101 via the multilayer metal grid 105. The monomer vapor pipe 110 is provided with an outlet in front of discharge cavity 104 in the vacuum chamber 101. A monomer vapor gas enters the vacuum chamber 101 via monomer vapor pipe 110. In addition, a tail gas collecting tube 111 is coaxially provided the vacuum chamber 101 along the axis of the vacuum chamber 101. The tail gas collecting tube vertically penetrates through the vacuum chamber 101. One end of the tail gas collecting tube 111 is connected to vacuum pump 116, and holes are evenly distributed on the wall of the tube. A tail gas enters the tail gas collecting tube via the holes on the tail gas collecting tube, and then is discharged from the vacuum chamber 101 by vacuum pump 116.

In the foregoing approach, in which the gas is fed via the side wall, transported radially, and discharged along the direction of central axis, the gas transport process takes place in a convergent manner, which can facilitate an increased stability of reactive species concentration in the space polymerization reaction, and a more evenly distribution of reactive species. In one embodiment, the process starts by generating polymerization reaction reactive species when the monomer vapor comes into contact with the carrier gas-based plasma in the vicinity of discharge cavity 104. Activated by the carrier gas, the generated polymerization reactive species are radially dispersed towards the axis of the vacuum chamber 101. As device 115 is rotated within vacuum chamber 101, the amount of the polymerization reaction reactive species gradually decreases due to continuous consumption. Simultaneously, the polymerization reaction reactive species also gradually converge, which can compensate for the foregoing decrease in the amount of the polymerization reaction reactive species. In this way, the concentration of the polymerization reaction reactive species can remain stable. The bulk density of the reactive species in the vacuum chamber 101 can remain unchanged, and thus the batch treatment can enjoy good uniformity.

In other words, the reactive species discharge mechanisms and the collecting tube can be collectively configured in a way such that, a density decrease in the reactive species due to consumption of the reactive species can be substantially equal to a density increase in the reactive species due to the reactive species converging toward the collecting tube. Therefore, the coordinated operation of the reactive specifies discharge mechanism and tail gas collecting tube 111 can provide uniform density of the reactive species across vacuum chamber 101 and onto device 115. Specifically, in some implementations, a discharge rate of the discharge mechanism can be adjusted (e.g., via controlling the applied electrical power and/or an amount of gas) together with an exhaust rate of the collecting tube (e.g., via adjusting the power of vacuum pump) such that a substantially uniform density of the reactive species across the vacuum chamber 101 can be achieved. In many embodiments, the aforesaid collective adjustment of the discharge mechanism and the collecting tube corresponds to the shape of the cross section of the inner side wall of a given vacuum chamber 101. That is to say, in these embodiments, the combination of the discharge rate of the discharge mechanism and the exhaust rate of the collecting tube is preferably tailored to match the particular shape (e.g., a circle, or a polygon) of the given vacuum chamber 101 so as to achieve the substantially uniform density of the reactive species.

As compared to conventional coating devices and technology, the difference in substrate coating thickness of the same batch treatment in the conventional coating devices can be greater than 30%, while the difference in substrate coating thickness of the same batch treatment using the disclosed devices can be smaller than 10%.

Second, the apparatus also employs rotation rack 112 to significantly improve the uniformity of each substrate coating. In one or more embodiments, the vacuum chamber 101 is provided with rotation rack 112. The planetary rotation platforms 114 on rotation rack 112 may perform planetary rotation movements in the vacuum chamber 101. In particular, the disclosed mechanism allows each planetary rotation platforms 114 to rotate along planetary rotation axes (e.g., along planetary rotation shafts 113) while making a revolutionary movement in a concentric path relative to the central axis of the vacuum chamber 101 (e.g., along the rotation of rotation rack 112 coupled to tail gas collecting tube 111).

Device 115 to be treated can be placed on a planetary rotation platforms 114. The introduced planetary rotary movement allows the spatial position and orientation of each substrate treated to change continuously during the process of the treatment, such that all of the spatial positions of different substrates in the process of coating treatment can be substantially the same, thereby eliminating the difference in coating due to different spatial positions of different substrates in the existing technology. Accordingly, the introduced techniques may achieve the same coating effects and better uniformity for substrates of different locations in the same batch.

Third, the apparatus is able to greatly increase the volume of the vacuum chamber 101, and significantly improve the treatment efficiency. Due to the improvements in the structures of vacuum chamber 101 and rotation rack 112, coating film thickness uniformity can be greatly improved for the treatment in the same batch. In addition, the volume of the vacuum chamber 101 may be expanded by 5 to 6 times. Accordingly, the batch treatment quantity and treatment efficiency have been greatly increased. In some embodiments, the apparatus according to the present disclosure can effectively protect the monomer vapor from being decomposed and destructed so as to obtain a high-quality polymer coating.

Plasma Polymerization Coating Process

One aspect of the techniques disclosed herein includes a reactive species discharge process. In one embodiment, the process begins by positioning a substrate on a substrate platform located in a vacuum chamber. The atmosphere of vacuum chamber 101 is evacuated by a vacuum pump via an air exhaust port of a collecting tube positioned along a central axis of vacuum chamber 101. The process proceeds by rotating, by a rotary motor, a primary rotation rack coupled to a primary rotation shaft. In some embodiments, the primary rotation rack is configured to rotate along the central axis. Then, a carrier gas is discharged to a discharge cavity via an inlet valve. The carrier gas can facilitate a reaction between the substrate and the reactive species. The process continues by discharging, monomer vapor into vacuum chamber 101 using a feeding port. The process creates, the reactive species by polymerizing the monomer vapor in vacuum chamber 101 using carrier gas. The process then deposits the reactive species onto the surface of the substrate to form a polymer coating.

Figure 3:
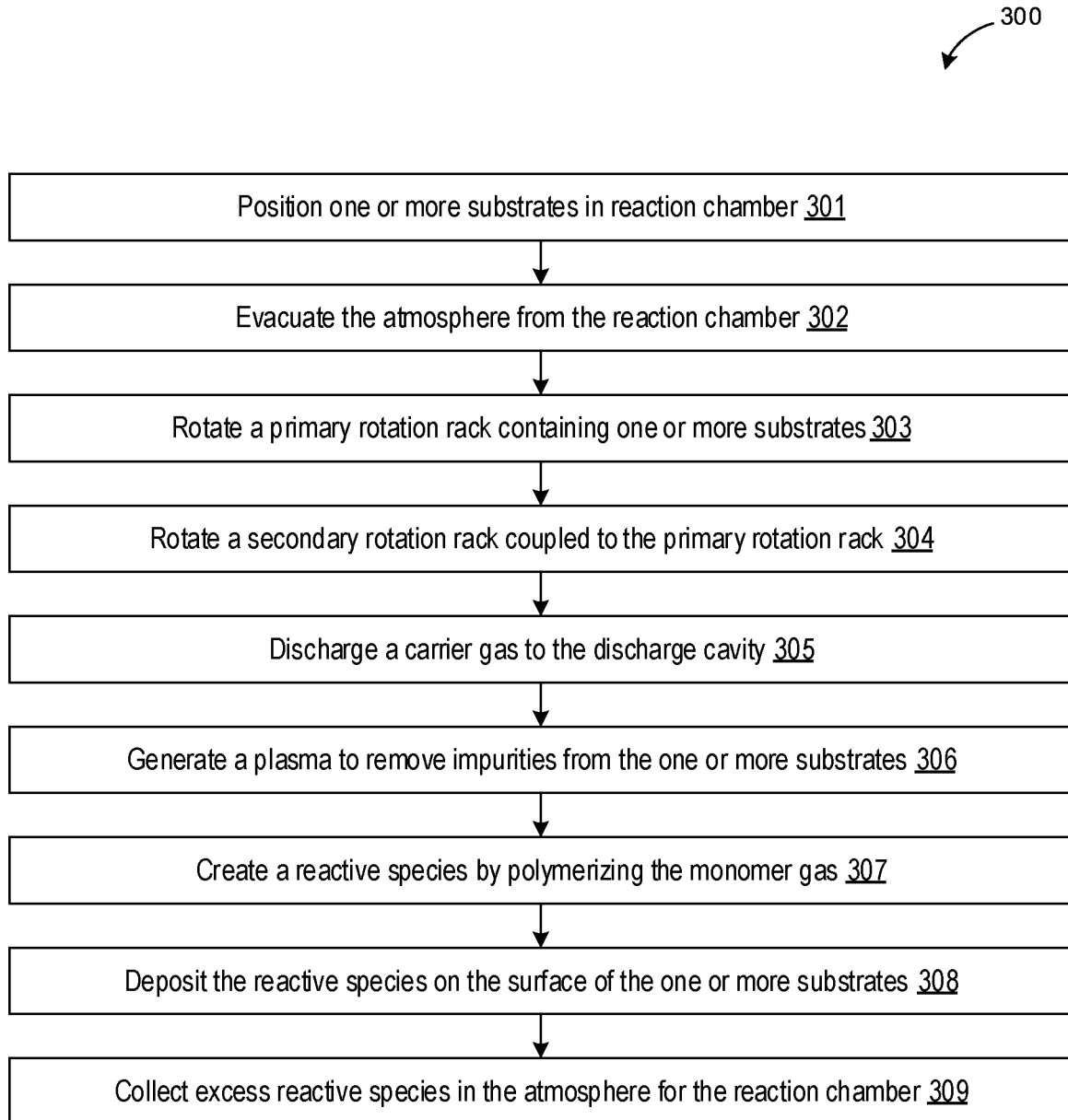
FIG. 3 is a flow diagram that illustrates an example process for plasma polymerization.

FIG. 3 is a flowchart illustrating an exemplary reactive species discharge process 300. In some embodiments, process 300 controls and coordinates the various components of plasma polymerization coating apparatus 100.

In step 301, device 115 is placed within vacuum chamber 101. In some embodiments, device 115 is placed on planetary rotation platforms 114 as depicted in FIGS. 1 and 2. The placement of device 115 on planetary rotation platforms 114 facilitates the movement of the device 115 across vacuum chamber 101 during the plasma polymerization coating process. By traveling around the different areas of the vacuum chamber 101, the negative effects of plasma density variations are reduced or eliminated to allow for a more even plasma coating on the substrate.

In step 302, vacuum pump 116 may evacuate the atmosphere within vacuum chamber 101. In some embodiments, controller 117 transmits control signals to vacuum pump 116 to control the evacuation of the atmosphere within vacuum chamber 101. This process ensures that the atmosphere does not interfere with the plasma polymerization process and facilitates plasma polymerization processes that require a vacuum. In some examples, vacuum pump 116 is coupled to tail gas collecting tube 111 to create a negative atmospheric pressure in tail gas collecting tube 111 relative to the atmospheric pressure of vacuum chamber 101. The negative atmospheric pressure creates a flow of gases out of vacuum chamber 101. Controller 117 may transmit control signals to vacuum pump 116 to control the timing, power, and other operational parameters used for evacuating the atmosphere.

In step 303, rotation rack 112 rotates device 115 in vacuum chamber 101. In some embodiments, the controller may transmit control signals to rotary motor 118 to control the rotation rate of the rotation rack 112 to provide the same rate of spatial movement for each of the one or more substrates during the coating process in order to achieve uniform coating. Specifically, controller 117 transmits control signals to rotation rack 112 containing device 115 for plasma polymerization coating. Upon receiving the control signals, rotation rack 112 can rotate to cause the device 115 to rotate within vacuum chamber 101 in accordance with various embodiments of the invention. In some embodiments, rotation rack 112 contains planetary rotation shafts 113 and planetary rotation platforms 114 for holding device 115 undergoing the plasma polymerization process. The rotary motor 118 generates the rotation motion of rotation rack 112. Controller 117 may transmit control signals to rotary motor 118 that control the timing, duration, and rate of the rotation.

In step 304, planetary rotation shafts 113 and planetary rotation platforms 114 rotates device 115 in vacuum chamber 101. In some embodiments, the secondary rotation rack rotates on a secondary axis different from the central axis. Specifically, controller 117 transmits control signals to planetary rotation shafts 113. The control signals cause planetary rotation shafts 113 to independently rotate along a secondary axis in accordance with various embodiments of the invention. The additional rotation provides for a wider range of movement of device 115 within vacuum chamber 101. This allows for additional mitigation of negative effects caused by plasma density variations by further changing the position and orientation of each device 115 to be treated.

In step 305, carrier gas is introduced into discharge cavity 104. In some embodiments, controller 117 transmits control signals to carrier gas pipe 109 to cause it to introduce carrier gas into discharge cavity 104 to activate the monomer vapor. When the carrier gas is introduced into discharge cavity 104, an electrical charge is applied by discharge power source 108 to discharge source 107. Due to the electrical charge, the carrier gas gets ionized in discharge cavity 104 and becomes plasma (i.e., a mixture of positive ions and electrons produced by ionization). In some embodiments, the carrier gas is continually introduced into discharge cavity 104 and becomes plasma throughout the polymerization process until step 309. Controller 117 may transmit control signals that control the timing and amount of carrier gas that is introduced into discharge cavity 104 as well as the timing and power applied by discharge power source 108 to discharge source 107.

In step 306, process 300 optionally generates a treatment plasma to remove impurities from the surface of the one or more device 115. In certain embodiments, the treatment plasma may be introduced into vacuum chamber 101 prior to discharging the reactive species to vacuum chamber 101. In other embodiments, the treatment plasma may also be generated after the reactive species is deposited on the surface of the substrate.

In some embodiments, the treatment plasma is generated by an electrode coupled to a radio frequency power source. Specifically, controller 117 transmits control signals to radio frequency power source 103 to generate an electrical charge that generates plasma in vacuum chamber 101. The plasma is generated to remove impurities from device 115 undergoing plasma polymerization. Additionally, the plasma may activate the surface of device 115 to allow binding between the surface of device 115 and the plasma to form the plasma polymerization coating. In some embodiments, a carrier gas may be introduced from carrier gas pipe 109 to propagate the plasma throughout vacuum chamber 101. Controller 117 may transmit control signals that control the timing, power, and other operational parameters to radio frequency power source 103 to porous electrode 102. In some examples, continuous flow of carrier gas may occur during this step.

In step 307, reactive species is generated for application to the surface of device 115 undergoing plasma polymerization. A reactive species is generated when introducing plasma to monomer vapor. Energy from the plasma is transferred from the plasma to the monomer vapor to activate the monomer vapor. In some embodiments, controller 117 transmits control signals to monomer vapor pipe 110 to introduce monomer vapor into vacuum chamber 101. Controller 117 also transmits control signals to discharge power source 108 to regulate the timing and amount of power to apply to discharge source 107. When power is applied from discharge power source 108 to discharge source 107, the carrier gas in discharge cavity 104 becomes plasma. This provides a mechanism to control when the discharge cavity 104 produces the plasma.

Additionally, controller 117 may provide control signals to pulse power source 106 to regulate the power applied to metal grid 105. Metal grid 105 is coupled to pulse power source 106 and arranged at the connecting positions of the discharge cavities and the inner walls of vacuum chamber 101. Metal grid 105 regulates the flow of the plasma generated in step 305 that enters vacuum chamber 101 and the backflow of carrier gas into discharge cavity 104. In some embodiments, controller 117 may provide control signals that control the timing and amount of carrier gas that is introduced into discharge cavity 104.

Specifically, when power is applied to metal grid 105, plasma can pass through metal grid 105, and when power is not applied to metal grid 105, plasma is blocked from passing through the metal grid 105. When the plasma travels through metal grid 105 into vacuum chamber 101, the plasma transfers energy to the monomer vapor to activate the monomer vapor to a high-energy state (i.e., the monomer vapor become activated species). In some embodiments, the carrier vapor may even cause some chemical bonds of the monomer to break and form reactive particles such as free radicals. Also, in some examples, continuous flow of carrier gas may occur during this step.

In step 308, the reactive species created in step 307 may be deposited to the surface of device 115 undergoing plasma polymerization. Specifically, the polymerization reaction reactive species is generated from monomer vapor when the monomer vapor comes into contact with the plasma released in step 307 from discharge cavity 104. Activated by the carrier gas plasma, the generated polymerization reactive species are radially dispersed towards the axis of the vacuum chamber 101 and onto device 115. In some embodiments, after the reactive species is introduced to the vacuum chamber 101, the vacuum chamber 101 will have a combination of ionized species, free electrons, free radicals, excited molecules or atoms, and unchanged gas.

In step 309, reactive species discharge process 300 collects excess reactive species in the atmosphere of vacuum chamber 101 by reducing the air pressure at the collecting tube to be lower than the air pressure of vacuum chamber 101. The exhaust rate of the vacuum pump is configured to account for: (1) the density decrease in the reactive species within vacuum chamber 101 resulting from the deposition of the reactive species on to the substrate, (2) the density increase in the reactive species in vacuum chamber 101 resulting from the reactive species converging toward the center of the chamber such that the density of the reactive species across vacuum chamber 101 is uniform, (3) the increase in reactive species within vacuum chamber 101 based on the rate in which monomer vapor is introduced into the reaction chamber, (4) the increase in reactive species within vacuum chamber 101 based on the rate in which electrical power is applied to carrier gas to generate plasma, and (5) the increase in reactive species within vacuum chamber 101 based on the rate in which energy from the plasma is transferred to the monomer vapor.

Specifically, controller 117 transmits control signals to vacuum pump 116 to evacuate excess gas, plasma, and reactive species from the atmosphere of vacuum chamber 101. Vacuum pump 116 is coupled to tail gas collecting tube 111 to create a negative atmospheric pressure in tail gas collecting tube 111 relative to the atmospheric pressure of vacuum chamber 101. The negative atmospheric pressure creates a flow of gases out of vacuum chamber 101.

In some embodiments, step 306 (i.e., the pre-treatment step) should be longer than one planetary rotation cycle, so that all the substrate samples have traveled to the closest point to the porous electrode to accept plasma. For example, step 306 may require between 1-30 minutes. In comparison, step 308 is determined by the film thickness required. In general, step 308 should take longer than the other steps. For example, step 306 may require between 20-300 minutes. Finally, step 309 should be executed until excess monomers are exhausted from the chamber. For example, step 309 may require between 1-10 minutes.

Processing System

Figure 4:
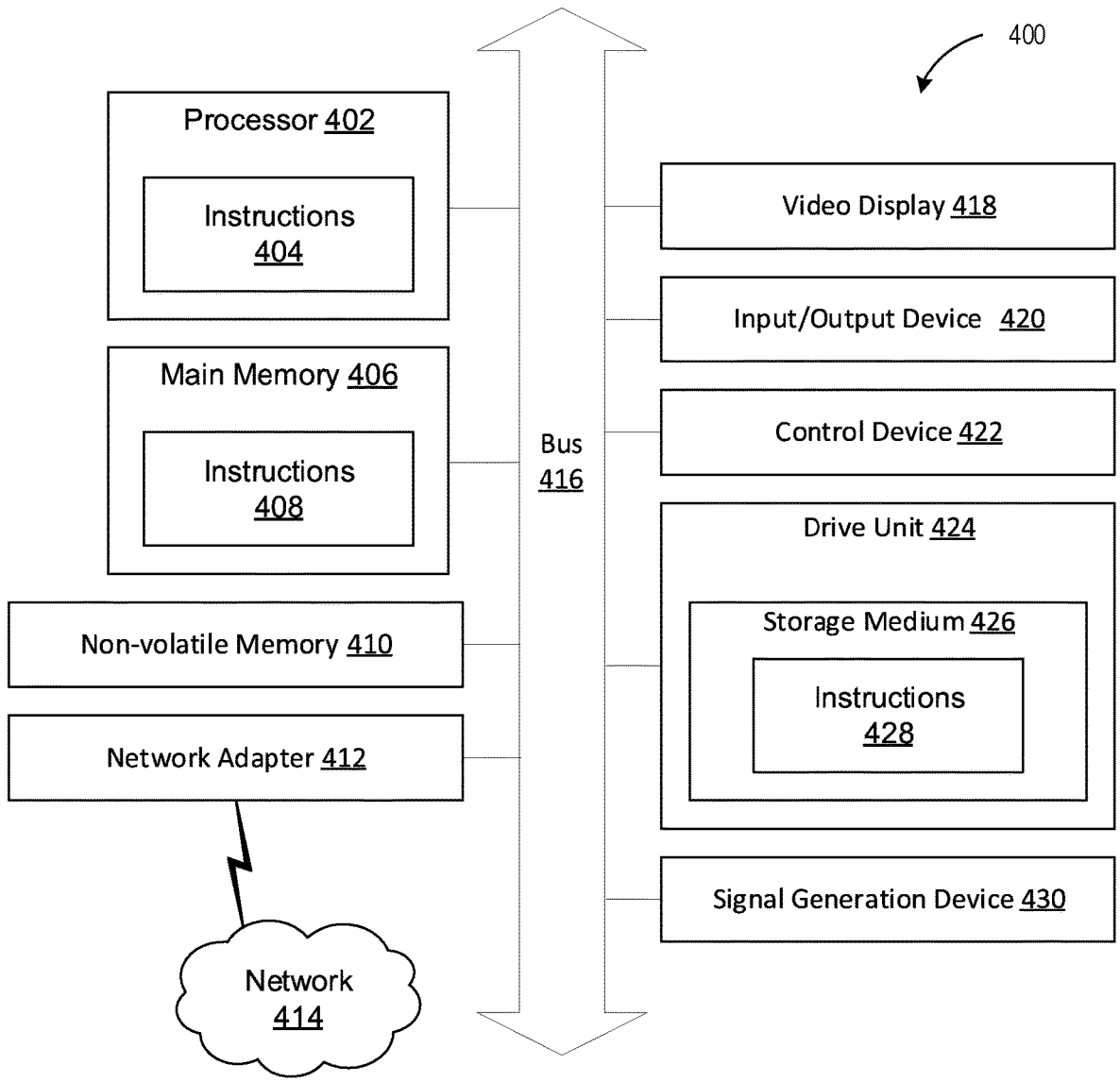
FIG. 4 is a block diagram illustrating an example of a processing system in which at least some operations described herein can be implemented.

FIG. 4 is a block diagram illustrating an example of a processing system 400 in which at least some operations described herein can be implemented. For example, some components of the processing system 400 may be implemented in a controller device (e.g., controller 117 of FIGS. 1 and 2).

The processing system 400 may include one or more central processing units ("processors") 402, main memory 406, non-volatile memory 410, network adapter 412 (e.g., network interface), video display 418, input/output devices 420, control device 422 (e.g., keyboard and pointing devices), drive unit 424 including a storage medium 426, and signal generation device 430 that are communicatively connected to a bus 416. The bus 416 is illustrated as an abstraction that represents one or more physical buses and/or point-to-point connections that are connected by appropriate bridges, adapters, or controllers. The bus 416, therefore, can include a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus (also referred to as "Firewire").

The processing system 400 may share a similar computer processor architecture as that of a desktop computer, tablet computer, personal digital assistant (PDA), mobile phone, game console, music player, wearable electronic device (e.g., a watch or fitness tracker), network-connected ("smart") device (e.g., a television or home assistant device), virtual/augmented reality systems (e.g., a head-mounted display), or another electronic device capable of executing a set of instructions (sequential or otherwise) that specify action(s) to be taken by the processing system 400.

While the main memory 406, non-volatile memory 410, and storage medium 426 (also called a "machine-readable medium") are shown to be a single medium, the term "machine-readable medium" and "storage medium" should be taken to include a single medium or multiple media (e.g., a centralized/distributed database and/or associated caches and servers) that store one or more sets of instructions 428. The term "machine-readable medium" and "storage medium" shall also be taken to include any medium that is capable of storing, encoding, or carrying a set of instructions for execution by the processing system 400.

In general, the routines executed to implement the embodiments of the disclosure may be implemented as part of an operating system or a specific application, component, program, object, module, or sequence of instructions (collectively referred to as "computer programs"). The computer programs typically comprise one or more instructions (e.g., instructions 404, 408, 428) set at various times in various memory and storage devices in a computing device. When read and executed by the one or more processors 402, the instruction(s) cause the processing system 400 to perform operations to execute elements involving the various aspects of the disclosure.

Moreover, while embodiments have been described in the context of fully functioning computing devices, those skilled in the art will appreciate that the various embodiments are capable of being distributed as a program product in a variety of forms. The disclosure applies regardless of the particular type of machine or computer-readable media used to actually effect the distribution.

Further examples of machine-readable storage media, machine-readable media, or computer-readable media include recordable-type media such as volatile and non-volatile memory devices 410, floppy and other removable disks, hard disk drives, optical disks (e.g., Compact Disk Read-Only Memory (CD-ROMS), Digital Versatile Disks (DVDs)), and transmission-type media such as digital and analog communication links.

The network adapter 412 enables the processing system 400 to mediate data in a network 414 with an entity that is external to the processing system 400 through any communication protocol supported by the processing system 400 and the external entity. The network adapter 412 can include a network adaptor card, a wireless network interface card, a router, an access point, a wireless router, a switch, a multi-layer switch, a protocol converter, a gateway, a bridge, bridge router, a hub, a digital media receiver, and/or a repeater.

The network adapter 412 may include a firewall that governs and/or manages permission to access/proxy data in a computer network and tracks varying levels of trust between different machines and/or applications. The firewall can be any number of modules having any combination of hardware and/or software components able to enforce a predetermined set of access rights between a particular set of machines and applications, machines and machines, and/or applications and applications (e.g., to regulate the flow of traffic and resource sharing between these entities). The firewall may additionally manage and/or have access to an access control list that details permissions including the access and operation rights of an object by an individual, a machine, and/or an application, and the circumstances under which the permission rights stand.

Figure 5:
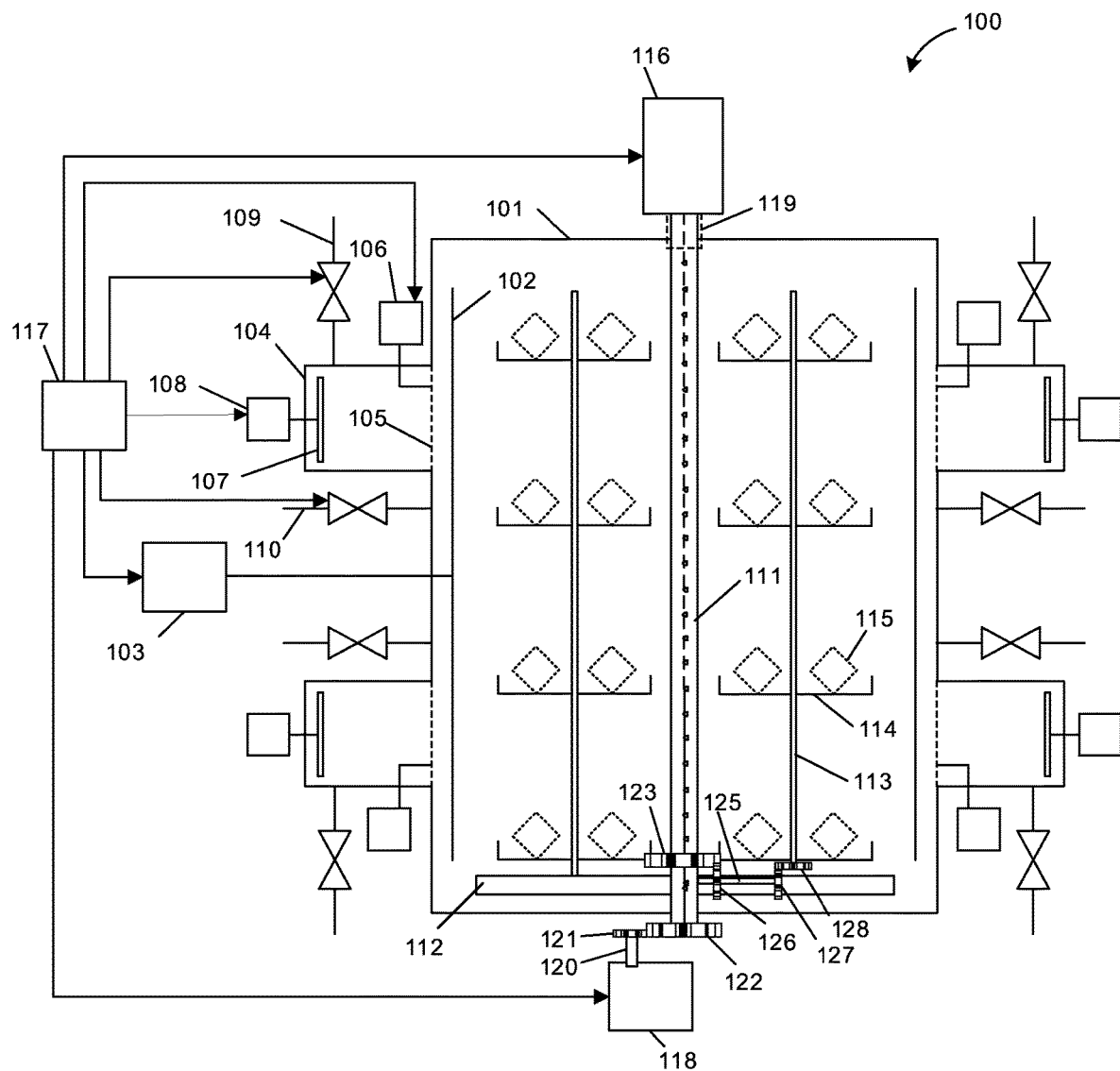
FIG. 5 is a schematic front sectional view of the example plasma polymerization coating apparatus with optional shafts and gears for rotating rotation racks and planetary rotation shafts, according to one or more embodiments of the present disclosure.

FIG. 5 is a schematic front sectional view of example plasma polymerization coating apparatus 100 with optional shafts and gears for rotating rotation rack 112 and/or planetary rotation shafts 113. In some embodiments, the polymerization coating apparatus 100 may include rotary motor 118, motor shaft 120, motor shaft gear 121, tail gas collecting tube primary gear 122, tail gas collecting tube secondary gear 123, rotation rack shaft 125, rotation rack shaft primary gear 126, rotation rack shaft secondary gear 127, and planetary rotation shaft gear 128.

In some embodiments, rotary motor 118 is coupled to motor shaft 120, which may protrude from the housing of rotary motor 118. Additionally, motor shaft 120 may be coupled to motor shaft gear 121. Additionally, tail gas collecting tube 111 may be coupled to tail gas collecting tube primary gear 122 and tail gas collecting tube secondary gear 123. Similarly, rotation rack shaft 125 may be coupled to rotation rack shaft primary gear 126 and rotation track shaft secondary gear 127.

In certain embodiments, the operation of rotary motor 118 rotates tail gas collecting tube 111. Specifically, motor shaft gear 121 may be engaged with tail gas collecting tube primary gear 122. When rotary motor 118 rotates motor shaft 120, motor gear 121 drives tail gas collecting tube primary gear 122. As mentioned above, tail gas collecting tube 111 is coupled to, and therefore rotates with, tail gas collecting tube primary gear 122. In effect, the rotational motion generated by rotary motor 118 is transferred from motor shaft 120 to tail gas collecting tube 111 via motor gear 121 and tail gas collecting tube primary gear 122.

In some embodiments, the rotational motion of tail gas collecting tube 111 is transferred to rotation rack shaft 125. As mentioned above, tail gas collecting tube secondary gear 123 is coupled to, and therefore rotates with, tail gas collecting tube 111. Additionally, tail gas collecting tube secondary gear 123 is engaged with rotation rack shaft primary gear 126. Therefore, when tail gas collecting tube 111 rotates, tail gas collecting tube secondary gear 123 also drives the rotation of rotation rack shaft primary gear 126. Since rotation rack shaft primary gear 126 is coupled to rotation rack 125, the rotation of rotation rack shaft primary gear 126 drives the rotation of rotation rack 125. In some examples, rotation rack shaft 125 may be enclosed within rotation rack 112, implemented as a sleeve enclosing rotation rack 112, or otherwise implemented in any manner that transfers rotational motion from tail gas collecting tube 111 to planetary rotation shafts 113.

In various embodiments, the rotational motion of rotation rack shaft 125 is transferred to planetary rotation shafts 113. As mentioned above, rotation rack shaft secondary gear 127 is coupled to, and therefore rotates with, rotation rack 125. Additionally, rotation rack secondary gear 127 is engaged with planetary rotation shaft gear 128. Therefore, when rotation rack 125 rotates, rotation rack secondary gear 127 also drives the rotation of planetary rotation shaft gear 128. Since planetary rotation shaft gear 128 is coupled to planetary rotation shafts 113, the rotation of planetary rotation shaft gear 128 drives the rotation of planetary rotation shafts 113.

One effect of the optional shafts and gears is that rotational motion generated by rotary motor 118 is transferred to tail gas collecting tube 111 and/or planetary rotation shafts 113 at various controlled rotational rates. For example, a series of gears of various diameters may be used to implement a gear ratio to achieve a desired torque or rotational rate. Additionally, the various gears may be engaged to transfer rotational motion between gears or disengaged to stop the transfer of rotational motion between gears. Further, the series of gears of various diameters may be contained in a gearbox. In another example, the series of gears may be divided into groups (e.g., motor shaft gear 121 and tail gas collecting tube primary gear 122 in one group), and each group of gears may be contained within a gearbox housing. Additionally, the one or more gearboxes may be communicatively coupled the controller 117 for receiving control signals. For example, the control signals may indicate the size of the gears to select as well as the gears to engage or disengage.

For example, the tail gas collecting tube 111 and/or planetary rotation shafts 113 may be rotated at a controlled rate by selecting specific size ratios of the various gears. Specifically, the size ratio of motor shaft gear 121 and tail gas collecting tube primary gear 122 may be selected to ensure that tail gas rotation rack 112, and in turn rotation platforms 114, rotate along a central axis of vacuum chamber 101 at a controlled rate. Similarly, a size ratio of tail gas collecting tube secondary gear 123 and rotation rack shaft 125 may be selected to ensure that rotation rack shaft 125 rotates at yet another controlled rate. Finally, a size ratio of rotation rack shaft secondary gear 127 and planetary rotation shaft gear 128 may be selected to ensure that planetary rotation shafts 113 rotates at a specific controlled rate. Therefore, the size ratios of tail gas collecting tube secondary gear 123, rotation rack shaft 125, rotation rack shaft secondary gear 127, and planetary rotation shaft gear 128 may be selected to ensure that planetary rotation shafts 113, and in turn rotation platforms 114, rotate along a planetary axis of vacuum chamber 101 at a controlled rate.

The controlled rates may ensure that a plasma polymerization coating is uniformly applied to the one or more device 115. The controlled rates may be a rate that is fast enough so that each of the one or more device 115 may traverse the various regions of vacuum chamber 101 that have varying densities of monomer vapors, carrier gases, plasma, reactive species, etc. By ensuring that each of the one or more device 115 traverses the various regions, each of the one or more substrates experiences the same atmospheric variations and receive the same uniform plasma polymerization coating across each substrate. Additionally, the controlled rate may ensure that the orientation of each of the one or more device 115 is shifted to ensure that the uniform plasma polymerization coating is uniform across the surface of each individual substrate.

Figure 6:
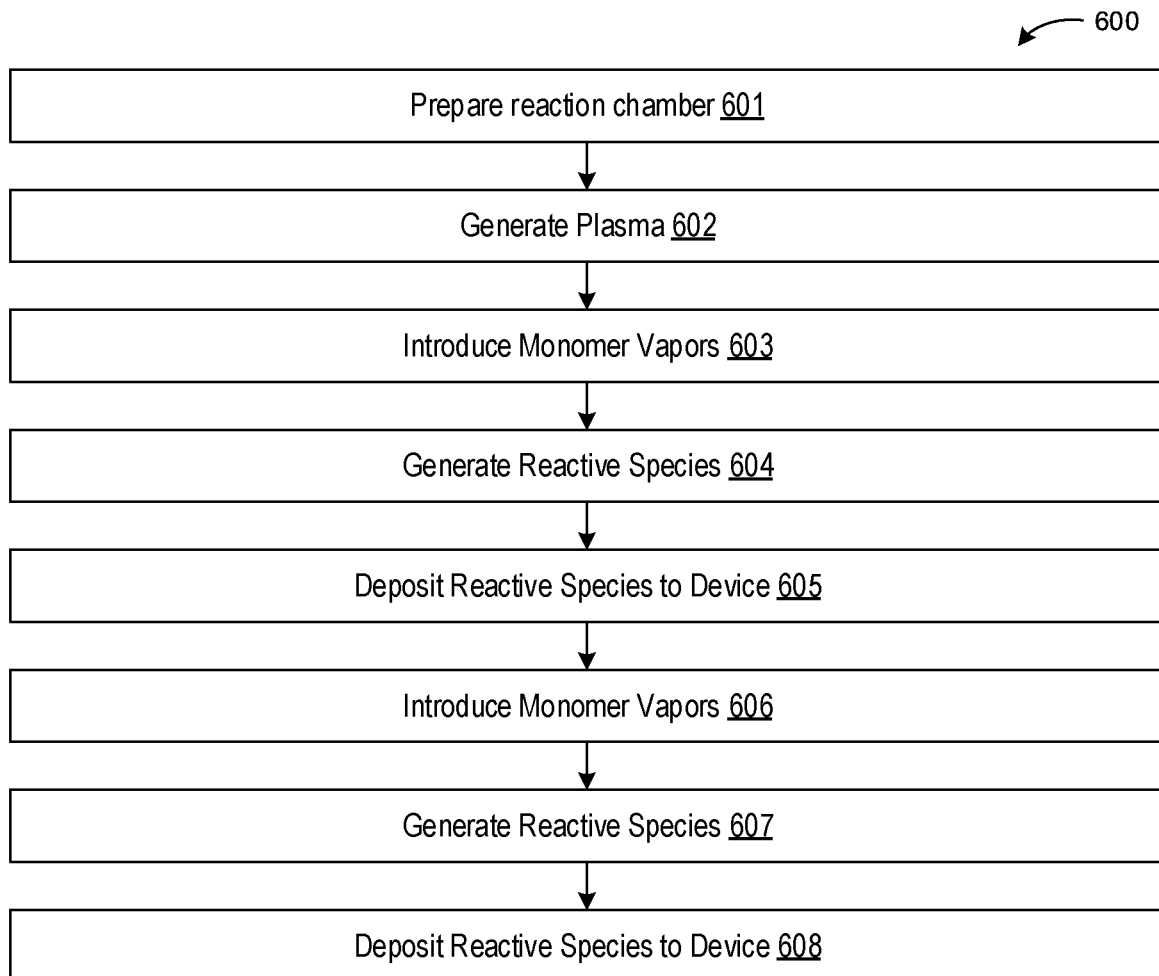
FIG. 6 is a flow diagram that illustrates another example process for plasma polymerization, according to one or more embodiments of the present disclosure.

FIG. 6 is a flowchart illustrating an exemplary reactive species discharge process 600. In some embodiments, process 600 may be performed by the various components of plasma polymerization coating apparatus 100. Additionally, process 600 may be used to apply a plasma polymerization coating to device 115.

In step 601, process 600 prepares vacuum chamber 101 for performing exemplary reactive species discharge process 600 to device 115. The initialization operation is performed to ensure that proper conditions are met before the plasma polymerization coating is applied. In certain embodiments, step 601 may be performed in a manner that is consistent with steps 301-305 of FIG. 3.

As part of the initiation operation, device 115 may be properly positioned in vacuum chamber 101 for receiving the plasma polymerization coating. For example, device 115 may be placed on planetary rotation platforms 114 as depicted in FIGS. 1 and 2. The placement of device 115 on planetary rotation platforms 114 facilitates the movement of device 115 across vacuum chamber 101 during the plasma polymerization coating process to reduce the negative effects of plasma density variations and allow for a more uniform plasma coating on device 115.

In some embodiments, the atmospheric conditions of vacuum chamber 101 are properly set to ensure that the atmosphere is suitable for the plasma polymerization process. For example, vacuum chamber 101 may be closed so that vacuum pump 116 can evacuate the atmosphere in vacuum chamber 101 until the atmosphere reaches between 10 to 300 mTorr. In addition to pressure, the temperature of vacuum chamber 101 may be regulated to facilitate the plasma polymerization process. In some examples, the temperature of vacuum chamber 101 may be controlled to fall between 30 to 60° C.

The device may be moved in a consistent manner during any period in process 600. For example, plasma polymerization coating apparatus 100 may begin rotation of rotation rack 112 to rotate device 115 along the central axis of the vacuum chamber 101 at a controlled rotational rate. For example, rotation rack 112 may rotate device 115 along the central axis at a speed of between 1.5 to 2.5 rotations per minute. Additionally, plasma polymerization coating apparatus 100 may begin rotation of planetary rotation shafts 113 and planetary rotation platforms 114 to rotate device 115 in vacuum chamber 101 along a secondary axis at a controlled rotational. In some embodiments, the secondary rotation rack rotates on a secondary axis that is distal from the central axis of vacuum chamber 101.

Controller 117 may transmit control signals to rotary motor 116 and other components in plasma polymerization coating to device 115 to control the timing and rotational rate of rotation racks 112 and/or planetary rotation shafts 113. Additionally, the operation of rotation racks 112 and/or planetary rotation shafts 113 coincides with the application of electrical power to metal grid barrier 105 to simultaneously move the electrical connector throughout vacuum chamber 101 while depositing reactive species on the surface of device 115.

In some embodiments, the rotation of rotation racks 112 and/or planetary rotation shafts 113 results in the movement of device 115 within vacuum chamber 101. The movement may include a linear reciprocating motion or a curvilinear motion relative to a central axis of the reaction chamber. Additionally, the curvilinear motion may include one or more of a circular motion along the central axis, an elliptical motion along the central axis, a spherical motion, and a curvilinear motion with other irregular routes. Additionally, in some embodiments, the operation of rotation racks 112 and/or planetary rotation shafts 113 varies the orientation of device 115 relative to the central axis of vacuum chamber 101 during the deposition of the reactive species onto device 115. Additionally, the rotational rate of rotation racks 112 and planetary rotation shafts 113 may be configured independently.

In certain embodiments, treatment plasma may be introduced into vacuum chamber 101 to remove impurities from the surface of device 115 and prevent defects in the plasma polymerization coating. Additionally, the treatment plasma may activate the surface of device 115 to allow binding between the surface of device 115 and the reactive species used to form the plasma polymerization coating. The treatment plasma may be generated by applying an electrical charge from radio frequency power source 103 to porous electrode 102. In some embodiments, controller 117 may transmit control signals that control the timing, power, and other operational parameters to radio frequency power source 103. For example, the treatment plasma may be applied prior to discharging the reactive species to vacuum chamber 101 and/or after the reactive species is deposited on the surface of the substrate. In some examples, the power of the electrical charge applied by radio frequency power source 103 may be a continuous discharge, pulse electrical discharge, or a periodic alternating electrical discharge. Additionally, the power of the electrical charge and the duration of the electrical charge may be altered according to the desired plasma polymerization coating. In some examples, the electrical power applied by radio frequency power source 103 may be between 120-400 Watt and the duration of the electrical charge may be between 60 to 450 seconds.

In step 602, plasma is generated from carrier gas introduced from carrier gas pipe 109 into discharge cavity 104. The plasma is generated by applying an electrical discharge from discharge power source 108 to discharge source 107. In some embodiments, step 602 may be performed in a manner consistent with step 305 of FIG. 3. After the carrier gas is introduced into discharge cavity 104, an electrical charge is applied by discharge power source 108 to discharge source 107. The electrical charge ionizes the carrier gas and causes the carrier to become plasma. Controller 117 may transmit control signals that control the timing and amount of carrier gas that is introduced into discharge cavity 104 as well as the timing and power applied by discharge power source 108 to discharge source 107. In some embodiments, the carrier gas may include one or more of: helium, neon, krypton, and argon. However, a person of ordinary skill in the art may recognize that other elements may be used as the carrier gas based upon, for example, the ability to transfer energy to monomer vapors.

In certain embodiments, the electrical discharge may be generated using one or more of: a radio frequency discharge, microwave discharge, intermediate frequency discharge, sine or bipolar pulse waveform, high frequency discharge, and electric spark discharge. Additionally, the high frequency discharge and the intermediate frequency discharge may have a sine or bipolar pulse waveform. In some examples, the radio frequency discharge produces plasma though a high frequency electromagnetic field discharge. In other examples, the high frequency discharge and the intermediate frequency discharge have a sine or bipolar pulse waveform.

In yet another example, the microwave discharge uses microwave energy to excite plasma. The microwave method has the advantage of having high energy utilization efficiency. In addition, the microwave discharge does not use an electrode and the resulting plasma is pure. Therefore, the microwave discharge provides high quality, high speed, and large area application of the plasma polymerization coating.

In some embodiments, a pulse electrical discharge or a periodic alternating electrical discharge may be applied by discharge power source 108 to generate plasma for release into vacuum chamber 101 during specific periods of process 600. In one example, a pulse electrical discharge uses a power of between 50 to 200 Watts for a duration of between 600 to 3,600 seconds. Additionally, the frequency of the pulse electrical discharge may be between 1 to 1,000 HZ, and the duty cycle of the pulse may be between 1:1 to 1:500. In yet another example, the periodic alternating electrical discharge uses a power of 50-200 Watts for a duration of between 600 to 3,600 seconds. Additionally, the alternating frequency of the discharge may be between 1 to 1,000 HZ. In some embodiments, the periodic alternating electrical discharge may be a sawtooth waveform, a sine waveform, a square waveform, a full-wave rectifying waveform, or a half-wave rectifying waveform.

In step 603, a monomer vapor may be introduced into vacuum chamber 101. In some embodiments, step 603 may be performed in a manner consistent with step 307 of FIG. 3. The monomer vapor is used to generate reactive species that are deposited on device 115 to form the plasma polymerization coatings. Reactive species may be released from the monomer vapors when is energy transferred from plasma to the monomer vapor. In some embodiments, the monomer vapor may be partly discharged into discharge cavity 104 to be released into vacuum chamber 101. In other embodiments, monomer vapor may be released via monomer vapor pipe 110 directly into vacuum chamber 101 to avoid the monomer vapor from being discharged in discharge cavity 104. In yet other embodiments, controller 117 may transmit control signals to monomer vapor tail pipe 110 to select the type of monomer vapor to release, the rate the monomer vapor is released, and the timing in which the monomer vapor is released. In some embodiments, the monomer vapor is introduced into vacuum chamber 101 at a rate such that the atmosphere reaches between 10 to 300 mTorr.

Various monomer vapors may be selected to achieve a compact and uniform plasma polymerization coating with good electrical insulation properties and a low breakdown voltage. In some embodiments, the monomer vapors may include one or more of: a first vapor comprising at least one organic monomer with a low dipole moment, a second vapor comprising at least one polyfunctional unsaturated hydrocarbon and hydrocarbon derivative monomer, a third vapor comprising at least one monofunctional unsaturated fluorocarbon resin monomer, and a fourth vapor comprising at least one organosilicon monomer in a Si—Cl, Si—O—C, or ring structure.

The monomer vapor may include a first vapor comprising at least one organic monomer with a low dipole moment. The low dipole polymer with a low dipole moment may reduce the interference to electrical signals across the plasma polymerization coating. In certain embodiments, the first vapor may include one or more of: p-xylene, benzene, toluene, carbon tetrafluoride, a-methylstyrene, poly-p-dichlorotoluene, dimethylsiloxane, allylbenzene, decafluorobiphenyl, decafluorobenzophenone, perfluoro (allylbenzene), tetrafluoroethylene, hexafluoropropylene, 1H,1H-perfluorooctylamine, perfluorododecyl iodide, perfluorotributylamine, 1,8-diiodoperfluorooctane, perfluorohexyl iodide, perfluorobutyl iodide, perfluorodecyl iodide, perfluorooctyl iodide, 1,4-bis(2',3'-epoxypropyl) perfluorobutane, dodecafluoro-2-methyl-2-pentene, 2-(perfluorobutyl) ethyl methyl acrylate, 2-(perfluorooctyl) ethyl methyl acrylate, 2-(perfluorooctyl)iodoethane, perfluorodecyl ethyl iodide, 1,1,2,2-tetrahydro perfluorohexyl iodide, perfluorobutyl ethylene, 1H,1H,2H-perfluoro-1-decene, 2,4,6-tris(perfluoroheptyl)-1,3,5-triazine, perfluorohexyl ethylene, 3-(perfluorooctyl)-1,2-epoxypropane, perfluorocycloether, perfluorododecyl ethylene, perfluorododecyl ethyl iodide, dibromo-p-xylene, 1,1,4,4-tetraphenyl-1,3-butadiene, and polydimethylsiloxane (with molecular weight of 500-50,000).

The monomer vapor may also include a second vapor comprising at least one polyfunctional unsaturated hydrocarbon and hydrocarbon derivative monomer. The polyfunctional unsaturated hydrocarbon and hydrocarbon derivative monomer has at least two reactive groups to allow for the formation of a cross-linked polymeric coating. In some embodiments, the second vapor may include one or more of: 1,3-butadiene, isoprene, 1,4-pentadiene, trimethylolpropane ethoxylate triacrylate, tri(propylene glycol) diacrylate, poly (ethylene glycol) diacrylate, 1,6-hexanediol diacrylate, ethylene glycol diacrylate, diethylene glycol divinyl ether, and neopentyl glycol diacrylate.

The monomer vapor may further include a third vapor comprising at least one monofunctional unsaturated fluorocarbon resin monomer. The monofunctional unsaturated fluorocarbon resin monomer is advantageous because it allows for the formation of a waterproof polymeric coating. The third vapor may include one or more of: the monofunctional unsaturated fluorocarbon resin comprises: 3-(perfluoro-5-methyl hexyl)-2-hydroxy propyl methyl acrylate, 2-(perfluorodecyl) ethyl methyl acrylate, 2-(perfluorohexyl) ethyl methyl acrylate, 2-(perfluorododecyl) ethyl methyl acrylate, 2-perfluorooctyl ethyl acrylate, 1H,1H,2H,2H-perfluorooctyl acrylate, 2-(perfluorobutyl) ethyl acrylate, (2H-perfluoropropyl)-2-acrylate, (perfluorocyclohexyl) methyl acrylate, 3,3,3-trifluoro-1-propyne, 1-acetenyl-3,5-difluorobenzene, and 4-acetenyl benzotrifluoride.

Finally, the monomer vapor may include a fourth vapor comprising at least one organosilicon monomer in a Si—Cl, Si—O—C, or ring structure that is allows for the formation of wear resistant coatings. In some embodiments, the fourth vapor may include one or more of: tetramethoxysilane, trimethoxy hydrogen siloxane, triethoxyoctylsilane, phenyltriethoxysilane, vinyl tris(2-methoxyethoxy)silane, triethylvinylsilane, hexaethyl cyclo trisiloxane, 3-(methacryloyloxy)propyltrimethoxysilane, phenyltris (trimethylsiloxy) silane, diphenyl diethoxysilane, dodecyltrimethoxysilane, triethoxyoctylsilane, dimethoxysilane, and 3-chloropropyl trimethoxysilane.

The vapors that are used in step 603 depend on the coating that is being formed. For example, cross-linked structure monomers generate reactive species that improve the strength and water resistance of the plasma polymerization coating. In some embodiments, steps 603-605 are performed to apply a transition layer to the surface of device 115. The transition layer is an intermediate layer that forms between the surface of device 115 and the surface layer of the plasma polymerization coating. In some embodiments, the transition layer may include the second vapor comprising at least one polyfunctional unsaturated hydrocarbon and hydrocarbon derivative monomer and/or the fourth vapor comprising at least one organosilicon monomer in a Si—Cl, Si—O—C. As described above, the two vapors provide allows for the formation of a cross-linked polymeric coating and a structure that provides water resistance.

Process parameters used in process 600 may be varied based upon various characteristics of the monomer vapors and carrier gases. For example, the types of vapors or ratio of different vapors introduced in step 603 may be selected based upon the molecular bond energy, bond length, and differences in vaporization temperatures of different monomer vapors. Additionally, the higher the vaporization temperature, the temperature that is applied to the monomer vapor needs to be higher. In yet other embodiments, the rate at which the monomer vapors are discharged may be varied to affect the rate in which reactive species are generated and the resulting density of reactive species in vacuum chamber 101. In some examples, the monomer vapors may be discharged into the vacuum chamber at a rate of between 10 to 10-1000 μL/min.

Additionally, the energy applied to the first, second monomer vapor, and/or a carrier gas may be selected according to differences in molecular bond energy, bond length, and differences in vaporization temperatures of different monomers to generate a compact transition layer and surface layer that provides water resistance and a low breakdown voltage. As described above, energy from plasma is transferred to the monomer vapor to release reactive species that are deposited on device 115. The energy that is required depends on the monomer vapor that is used. For example, sufficient energy is required to break the molecular bonds of the monomer vapor and release the reactive species. If a reagent has larger bond energy, the energy applied to the monomer needs to be larger. Similarly, the shorter the bond length of the monomer, the greater the energy is required.

In step 604, reactive species are generated for application onto the surface of device 115. Reactive species are generated when plasma generated in step 602 is released into vacuum chamber 101 from discharge cavity 104 and energy from the plasma is transferred to the monomer vapors released in step 603. In some embodiments, step 604 may be performed in a manner consistent with step 307 of FIG. 3.

In some embodiments, the release of plasma from discharge cavity 104 into vacuum chamber 101 may be regulated by metal grid 105. Specifically, controller 117 may provide control signals to pulse power source 106 to regulate the power applied to metal grid 105. When power is applied to metal grid 105, plasma can pass through metal grid 105, and when power is not applied to metal grid 105, plasma is blocked from passing through the metal grid 105. In some embodiments, the plasma may cause chemical bonds of the monomer to break and form reactive particles such as free radicals.

In some embodiments, the release of plasma may be controlled by using a constant electrical discharge or a periodic electrical discharge to metal gate 105. For example, applying a constant electrical discharge to metal gate 105 allows plasma to constantly flow into vacuum chamber 101. In another example, applying a periodic electrical discharge to metal gate 105 allows plasma to periodically flow into vacuum chamber 101. The periodic electrical discharge may be a continuous electrical discharge or a discontinuous electrical discharge such as a pulse electrical discharge. A waveform is continuous if it forms an unbroken curve along a domain (e.g., the time domain). In contrast, a waveform is discontinuous if there is a break along the curve along that domain.

In some embodiments, the release of plasma may be performed using multiple stages. For example, the release of plasma may be performed using a stage that applies a constant electrical discharge to metal gate 105. The constant electrical discharge allows plasma to be constantly released from discharge cavity 104 into vacuum chamber 101. Another stage may be performed by applying a periodic electrical discharge to metal gate 105. The periodic electrical discharge may be a continuous or discontinuous electrical discharge. For example, a continuous electrical discharge may take the form of a sine waveform. In another example, a discontinuous electrical discharge may take the form of a sawtooth waveform, a square waveform, a full-wave rectifying waveform, a half-wave rectifying waveform, or a pulse discharge. A person of ordinary skill in the art will recognize that one or more stages may be performed using any combination of constant and periodic waveforms.

The periodic waveforms may be generated using a variety of techniques to affect the periodic electrical discharge that is applied to metal gate 105. In one embodiment, the amplitude and frequency of the waveform may be adjusted. For example, by increasing the amplitude of the waveform, a greater amount of electrical discharge is periodically applied to metal gate 105 to allow for a greater flow of plasma from discharge cavity 104 into vacuum chamber 101. In another example, increasing the frequency of the waveform causes the electrical discharge that is applied to metal gate 105 to alternate more quickly. This may result in the flow of plasma through metal gate 105 into vacuum chamber 101 to change more rapidly (e.g., alternate between a high plasma flow and a low plasma flow, or alternate between a plasma-on period and plasma-off period).

In yet another technique, composite waveforms may be formed by combining a number of other waveforms. In one embodiment, a square waveform may be combined with a sinusoidal waveform. The square waveform may be a periodic waveform that alternates between a minimum value and a maximum value. For example, the minimum value may be zero to provide an "off" state when no electrical discharge is applied to metal gate 105. The sinusoidal wave may be sine wave that has a higher frequency than the square wave. If the minimum value of the square wave is a negative value with an amplitude that is greater than the amplitude of the sine wave, then the combination of the two waves would still result in a periodic "off" state because the value of the composite wave remains less than zero during the minimum value of the square wave. When the square wave alternates to its maximum value, the composite waveform will have a sinusoidal waveform. In effect, the composite waveform alternates between an "on" or "off" state based upon whether the square waveform is at its maximum or minimum value, respectively. During the "on" state, the waveform provides an output value that alternates based upon the sine waveform.

In another embodiment, a DC bias waveform may be combined with a periodic waveform. The DC bias waveform may be used to configure the mean amplitude of the resulting composite waveform. For example, a positive DC bias waveform will increase the value of a square waveform. If the DC bias waveform is high enough to bring the minimum value of the square wave above zero, then the square wave will never have a value less than zero. Practically speaking, this means that an electrical discharge is always applied to metal gate 105 where the electrical discharge alternates between a higher electrical discharge and a lower electrical discharge.

Yet another technique for generating a waveform includes clipping an existing wave. Clipping is performed to limit a waveform once it exceeds a specific value. For example, a minimum toggle threshold may designate the minimum value of a waveform. When the waveform goes below that minimum toggle threshold, the waveform is clipped at the value of that threshold. For example, the minimum toggle threshold may be zero such that when the waveform drops below zero, the waveform will simply remain at zero. A waveform clipped by the minimum toggle threshold of zero will apply no electrical discharge to metal gate 105 and result in a plasma-off period. Similarly, a maximum toggle threshold may designate the maximum value of a waveform. When the waveform exceeds that maximum toggle threshold, the waveform is clipped at the value of that threshold. A person of ordinary skill in the art will recognize that various techniques may be combined to generate a waveform. For example, the composite waveform described above may be adjusted by a toggle threshold to limit the amplitude of the waveform.

A hybrid plasma polymerization process may be performed by utilizing the metal grid 105 to precisely control the pulse of plasma that flows into vacuum chamber 101. For example, a periodic electrical discharge as described above may be used to perform the hybrid plasma polymerization process. During the periodic electrical discharge, electrical discharge is periodically applied to metal gate 105. A plasma-on period occurs when electrical discharge is applied to metal gate 105. In contrast, a plasma-off period occurs when no electrical discharge is applied to metal gate 105.

In some embodiments, this hybrid process starts with a plasma-on period (i.e., when an electrical charge is applied to metal gate 105). As plasma flows into vacuum chamber 101 and is deposited on the surface of device 115 during the plasma-on period, a portion of the plasma polymer formation occurs by a fragmentation-polyrecombination process through the plasma-chemical activation of chemically polymerizable monomers such as vinyl or acrylic monomers. Subsequently, during a plasma-off period (i.e., when an electrical charge is not applied to metal gate 105), plasma does not flow into vacuum chamber 101. During this period, radical chain propagation occurs on the surface of device 115. In some examples, a greater portion of the plasma polymer formation is attributable to the radical chain propagation of the plasma-off period compared to the fragmentation-polyrecombination process of the plasma-on period. In some embodiments, alternating between the plasma-on period (i.e., fragmentation-polyrecombination process) and plasm-off period (i.e., radical chain propagation process) results in an alternating microstructure of layers that dissipates energy from the layers.

Using the precise control of plasma release provided by metal grid 105, a plasma polymerization coating with varying thicknesses of plasma-on and plasma-off sublayers may be produced. Specifically, the gradual structure may be produced by changing the thickness of each layer formed during a plasma-on or plasma-off period. For example, the thickness of each layer may decrease with each new layer applied onto device 115.

In step 605, the reactive species generated in step 604 are deposited to the surface of device 115 undergoing plasma polymerization. In some embodiments, step 605 may be performed in a manner consistent with step 308 of FIG. 3. The generated reactive species of step 604 may be radially dispersed towards the axis of the vacuum chamber 101 and onto device 115. In some embodiments, after the reactive species is introduced to the vacuum chamber 101, the vacuum chamber 101 will have a combination of ionized species, free electrons, free radicals, excited molecules or atoms, and unchanged gas. In some embodiments, free radicals are polymerized on the surface of device 115 to form a polymer coating.

The reactive species are deposited on the surface of device 115 to generate a compact and uniform plasma polymerization coating with good electrical insulation properties and a low breakdown voltage associated with the breakdown effect. Specifically, the breakdown effect is a mechanism that allows electrical conductivity through the coating. Since the polymer film is very thin and textured with numerous nanometer sized holes, a low voltage may provide electrically conductive channels when a low voltage is applied across the coating.

Consistent with various embodiments disclosed herein, the movement of device 115 (e.g., the movement started in step 601) may operate throughout process 600 to ensure that device 115 travels across the vacuum chamber 101 through different regions of the atmosphere to ensure a uniform application of the plasma polymerization coating. Additionally, the treatment plasma of step 601 may activate organic substrate of device 115 to form dangling bonds that facilitate coating deposition and enhance the binding force between the surface of device 115 and the plasma polymerization coating. The plasma polymerization coating resulting from step 605 may be a transition layer. In some embodiments, the transition layer is deposited directly on the surface of device 115. A surface layer may be subsequently deposited on the surface of the transition layer.

In step 606, monomer vapors are introduced into vacuum chamber 101. In some embodiments, step 606 may be performed in a manner consistent with step 603. The monomer vapor is used to generate reactive species that are deposited on device 115 to form the plasma polymerization coating. Reactive species may be released from the monomer vapors when is energy transferred from plasma to the monomer vapor.

The vapors that are introduced into vacuum chamber 101 in step 606 depend on the coating that is being formed. For example, cross-linked structure monomers generate reactive species that improve the strength and water resistance of the plasma polymerization coating. In some embodiments, steps 606-608 are performed to apply a surface layer to the surface of device 115. In some embodiments, the surface layer of the plasma polymerization coating is applied to the surface of the transition layer applied in steps 603-605. The surface layer may include a first vapor comprising at least one organic monomer with a low dipole moment and/or a third vapor comprising at least one monofunctional unsaturated fluorocarbon resin monomer. As described above, the first and third vapors allow for the formation of low dielectric constant coating and the formation of a waterproof polymeric coating.

In step 607, reactive species are generated in vacuum chamber 101. In some embodiments, step 607 may be performed in a manner consistent with step 604. Reactive species are generated when plasma generated in step 602 are released into vacuum chamber 101 from discharge cavity 104 and energy from the plasma is transferred to the monomer vapors released in step 603.

In step 608, the reactive species generated in step 604 are deposited to the surface of device 115 undergoing plasma polymerization. In some embodiments, step 608 may be performed in a manner consistent with step 605. The plasma polymerization coating resulting from step 608 may be a surface layer. In some embodiments, the surface layer may be deposited on the surface of the transition layer (e.g., the transition layer applied in steps 603-605).

Figure 7:
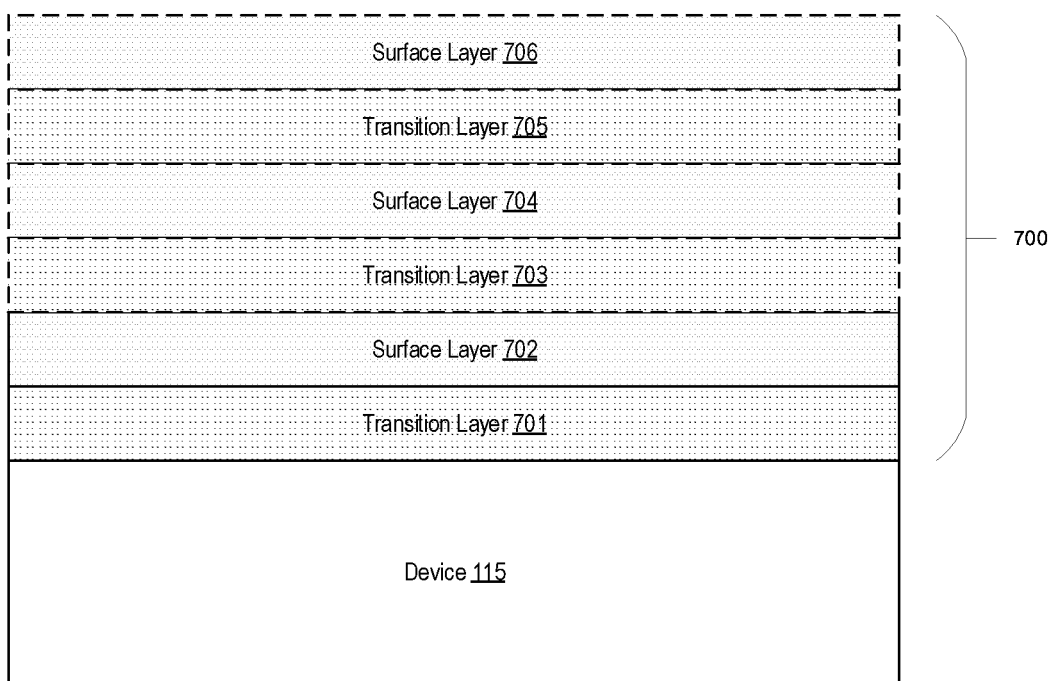
FIG. 7 is a diagram that illustrates an example plasma polymerization coating applied on a device, according to one or more embodiments of the present disclosure.

FIG. 7 is a diagram that illustrates an example plasma polymerization coating 700 applied on device 115. The plasma polymerization coating may include transition layer 701 and surface layer 702. The plasma polymerization coating may also include transition layer 703, surface layer 704, transition layer 705, and/or surface layer 706. Transition layers 701, 703, and 705 may be produced in a manner consistent with steps 603-605 of FIG. 6. Similarly, surface layers 702, 704, and 706 may be produced in a manner consistent with steps 606-608 of FIG. 6.

In some embodiments, transition layer 701 may be deposited directly on the surface of device 115. Subsequently, surface layer 702 may be subsequently deposited on the surface of transition layer 701. Similarly, transition layer 703 may be deposited on the surface of surface layer 702, surface layer 704 may be deposited on the surface of transition layer 703, transition layer 705 may be deposited on the surface of surface layer 704, and surface layer 706 may be deposited on the surface of transition layer 705.

In some embodiments, the transition layers 701, 703, 705 and/or surface layers 702, 704, 706 each may include one or more of: carbon, fluorine, oxygen, silicon, and hydrogen atoms. In some examples, the plasma polymerization coating may have a ratio of oxygen atoms to carbon atoms from between 1:3 to 1:20. To some extent, oxygen atoms are hydrophilic while carbon atoms are hydrophobic. Therefore, if the ratio of oxygen atoms to carbon atoms is too high, then the water resistance of the coating is degraded.

In some embodiments, the transition layers 701, 703, 705 and surface layers 702, 704, 706 each may be formed using a hybrid plasma polymerization process, such as the process described in step 604 of FIG. 6. The hybrid process starts with the plasma-chemical activation of chemically polymerizable monomers such as vinyl or acrylic monomers during the plasma-on period (i.e., when an electrical charge is applied to metal gate 105) to perform a fragmentation-polyrecombination process. Subsequently, during a plasma-off period (i.e., when an electrical charge is not applied to metal gate 105), radical chain propagation occurs on the surface of device 115. In some examples, a greater portion of the plasma polymer coating formation is attributable to the radical chain propagation of the plasma-off period compared to the fragmentation-polyrecombination process of the plasma-on period. For example, only a small fraction of the plasma polymerization coating may be produced using the fragmentation-polyrecombination process of the plasma-on period. In some embodiments, alternating between the radical chain propagation and the fragmentation-polyrecombination process results in an alternating arrangement of layers that dissipates energy from the plasma polymerization coating.

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. A reaction chamber for applying a multi-layer plasma chemical vapor deposition coating on an electrical device, the reaction chamber comprising:
    a primary rotation rack configured to rotate the electrical device along a central axis via a primary rotation shaft;
    a secondary rotation rack configured to secure the electrical device and rotate the electrical device along a planetary axis via a planetary rotation shaft coupled to the primary rotation rack;
    a tail gas collecting tube positioned along the central axis;
    a controller configured to transmit a control signal to cause a power source to apply a periodic electrical discharge to a metal grid located at an inner wall of the reaction chamber, wherein:
        the periodic electrical discharge includes a plasma-on period when electrical discharge is applied to the metal grid to direct plasma into the reaction chamber to generate a reactive species and a first sublayer is formed on the electrical device; and the periodic electrical discharge includes a plasma-off period when electrical discharge is not applied to the metal grid and a second sublayer is formed on the electrical device.

2. The reaction chamber of claim 1, wherein the periodic electrical discharge is a discontinuous pulse discharge or periodic alternating discharge.

3. The reaction chamber of claim 1, wherein the controller is configured to transmit a first rotation control signal to rotate, during the application of the first and second sublayer, the electrical device along the central axis of the reaction chamber via the primary rotation rack.

4. The reaction chamber of claim 3, wherein the first rotation control signal controls the rotation rate of the primary rotation rack and the electrical device along the central axis.

5. The reaction chamber of claim 1, wherein the controller is configured to transmit a second rotational control signal to rotate, during the application of the first and second sublayer, the electrical device along the planetary axis of the reaction chamber via the secondary rotation rack.

6. The reaction chamber of claim 5, wherein the second rotation control signal controls the rotational rate of the secondary rotation rack and electrical device along the planetary axis.

7. The reaction chamber of claim 1, further comprising:
a first monomer vapor pipe configured to discharge a first monomer vapor into the reaction chamber, the first monomer vapor releasing a first reactive species when energy from a first plasma is transferred to the first monomer vapor, and a second monomer vapor into the reaction chamber, the second monomer vapor releasing a second reactive species when energy from a second plasma is transferred to the second monomer vapor.

8. The reaction chamber of claim 1, further comprising a porous electrode proximal to the inner wall of the reaction chamber and configured to generate plasma in the reaction chamber.

* * * * *